(12) United States Patent
Okayasu et al.

(10) Patent No.: US 7,812,595 B2
(45) Date of Patent: Oct. 12, 2010

(54) ELECTRONIC DEVICE IDENTIFYING METHOD

(75) Inventors: Toshiyuki Okayasu, Tokyo (JP);
Shigetoshi Sugawa, Miyagi (JP);
Akinobu Teramoto, Miyagi (JP)

(73) Assignees: National University Corporation Tohoku University, Sendai-shi, Miyagi (JP); Advantest Corporation, Tokyo (JP)

( * ) Notice: Subject to any disclaimer, the term of this patent is extended or adjusted under 35 U.S.C. 154(b) by 42 days.

(21) Appl. No.: 12/032,998

(22) Filed: Feb. 18, 2008

(65) Prior Publication Data

US 2008/0180126 A1   Jul. 31, 2008

Related U.S. Application Data

(63) Continuation of application No. PCT/JP2005/015093, filed on Aug. 18, 2005.

(51) Int. Cl.
*G01R 31/28* (2006.01)
(52) U.S. Cl. ............. 324/158.1; 324/763; 700/115
(58) Field of Classification Search .......... 324/763, 324/764, 158.1; 700/115
See application file for complete search history.

(56) References Cited

U.S. PATENT DOCUMENTS

| | | | | |
|---|---|---|---|---|
| 4,928,002 | A * | 5/1990 | Corley et al. | 235/479 |
| 5,705,935 | A * | 1/1998 | Nishimura | 324/764 |
| 6,154,043 | A * | 11/2000 | Conboy et al. | 324/764 |
| 6,161,213 | A * | 12/2000 | Lofstrom | 716/4 |
| 6,456,554 | B1 * | 9/2002 | Gelsomini | 365/182 |
| 7,525,330 | B2 * | 4/2009 | De Jongh et al. | 324/763 |

FOREIGN PATENT DOCUMENTS

| | | |
|---|---|---|
| JP | 05-175430 | 7/1993 |
| JP | 2002197897 | 7/2002 |
| JP | 2002217257 | 8/2002 |
| WO | WO02/50910 | 6/2002 |

* cited by examiner

*Primary Examiner*—Ha Tran T Nguyen
*Assistant Examiner*—Richard Isla Rodas
(74) *Attorney, Agent, or Firm*—Osha • Liang LLP

(57) ABSTRACT

There is provided a device identifying method for identifying an electronic device including therein an actual operation circuit and a test circuit having a plurality of test elements provided therein, where the actual operation circuit operates during an actual operation of the electronic device and the test circuit operates during a test of the electronic device. The device identifying method includes measuring electrical characteristics of a plurality of test elements, storing identification information of an electronic device by storing the measured electrical characteristics of the respective test elements, obtaining identification information of a certain electronic device by measuring electrical characteristics of a plurality of test elements provided in the certain electronic device in order to identify the certain electronic device, comparing the identification information obtained in the identification information obtaining with the identification information stored in the identification information storing, and, when the obtained identification information matches the stored identification information, judging that the certain electronic device is the same as the electronic device associated with the stored identification information.

8 Claims, 14 Drawing Sheets

IDENTIFICATION INFORMATION

| COLUMN / ROW | X1 | X2 | X3 | X4 | ...... |
|---|---|---|---|---|---|
| Y1 | 1 | 1 | 0 | 1 | |
| Y2 | 1 | 1 | 1 | 1 | |
| Y3 | 0 | 1 | 1 | 0 | |
| Y4 | 1 | 1 | 1 | 1 | |
| ⋮ | | | | | |

*FIG. 5*

ELECTRONIC DEVICE IDENTIFYING METHOD

CROSS REFERENCE TO RELATED APPLICATION

This is a continuation application of PCT/JP2005/015093 filed on Aug. 18, 2005, the contents of which are incorporated herein by reference.

BACKGROUND

1. Technical Field

The present invention relates to an electronic device such as a semiconductor circuit, a device identifying method for obtaining identification of the electronic device, and a device manufacturing method for manufacturing the electronic device. More particularly, the present invention relates to an electronic device in which a test circuit such as a test element group (TEG) is provided, and to a device identifying method and a device manufacturing method in relation to the electronic device.

2. Related Art

According to a conventional manufacturing method of electronic devices such as semiconductor circuits, a plurality of electronic devices are formed on a single wafer, and the wafer is cut into pieces corresponding to the individual electronic devices. Therefore, once the wafer is cut into the separate electronic devices, it is difficult to identify, for example, the wafer on which and the position within the wafer at which each electronic device is originally formed. Accordingly, when the electronic devices experience defects, failure or the like, it is difficult to analyze the causes of the defects, failure or the like.

To solve this problem, a known technique attaches identification information to each electronic device. For example, known methods include appending an optical identifier to the surface of each electronic device and electrically storing identification information on each electronic device.

Related patent documents and other references have not been recognized, and thus not mentioned here.

The conventional identifying methods, however, require additional means for storing the identification information in each electronic device, as well as the normal circuit for the electronic device. Therefore, the conventional identifying methods degrade the area efficiency, manufacturing efficiency and the like of the electronic devices.

SUMMARY

Therefore, it is an object of an aspect of the innovations herein to provide an electronic device identifying method, an electronic device manufacturing method and an electronic device which are capable of overcoming the above drawbacks accompanying the related art. The above and other objects can be achieved by combinations described in the independent claims. The dependent claims define further advantageous and exemplary combinations of the innovations herein.

According to a first aspect related to the innovations herein, one exemplary device identifying method may include a device identifying method for identifying an electronic device including therein an actual operation circuit and a test circuit having a test element provided therein, where the actual operation circuit operates during an actual operation of the electronic device and the test circuit operates during a test of the electronic device. The device identifying method includes obtaining identification information of a certain electronic device by measuring a characteristic of a test element provided in the certain electronic device in order to identify the certain electronic device, comparing the identification information obtained in the identification information obtaining with prestored one or more pieces of identification information of electronic devices individually representing characteristics of test elements provided in the electronic devices, and, when the obtained identification information matches one of the prestored pieces of identification information, judging that the certain electronic device is the same as the electronic device associated with the matching identification information.

According to a second aspect related to the innovations herein, one exemplary device manufacturing method may include a device manufacturing method for manufacturing an electronic device including therein an actual operation circuit and a test circuit having a test element provided therein, where the actual operation circuit operates during an actual operation of the electronic device and the test circuit operates during a test of the electronic device. The device manufacturing method includes forming actual operation circuits of electronic devices in a wafer, forming first test circuits in the wafer on cutting lines along which the wafer is to be cut into the individual electronic devices, forming second test circuits in the wafer in regions different from the cutting lines, measuring characteristics of test elements provided in the first and second test circuits, storing pieces of identification information of the electronic devices by storing the characteristics of the test elements provided in the second test circuits, and cutting the wafer along the cutting lines into the individual electronic devices.

According to a third aspect related to the innovations herein, one exemplary electronic device may include an electronic device including an actual operation circuit that operates during an actual operation of the electronic device, a second test circuit and a third test circuit that operate during a test of the electronic device, and a power supply section that (i), during the actual operation of the electronic device, does not apply a power supply voltage to the second test circuit and applies power supply voltages to the actual operation circuit and the third test circuit, and (ii) to obtain identification of the electronic device, applies a power supply voltage to the second test circuit.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

BRIEF DESCRIPTION OF THE DRAWINGS

FIG. 5 illustrates, as an example, identification information of an electronic device 510 stored on an identification information storing section 20.

FIG. 7A illustrates a method used by the characteristic measuring section 16 when a plurality of electronic devices 510 are formed in the same wafer 500 to generate the identification information of each electronic device 510, and FIG. 7B illustrates a method used by the characteristic measuring section 16 after the wafer 500 is cut into the individual electronic devices 510 to generate the identification information of each electronic device 510.

DESCRIPTION OF EXEMPLARY EMBODIMENTS

Some aspects of the invention will now be described based on embodiments, which do not intend to limit the scope of the present invention, but exemplify the invention. All of the features and the combinations thereof described in the embodiment are not necessarily essential to the invention.

Figure 1:
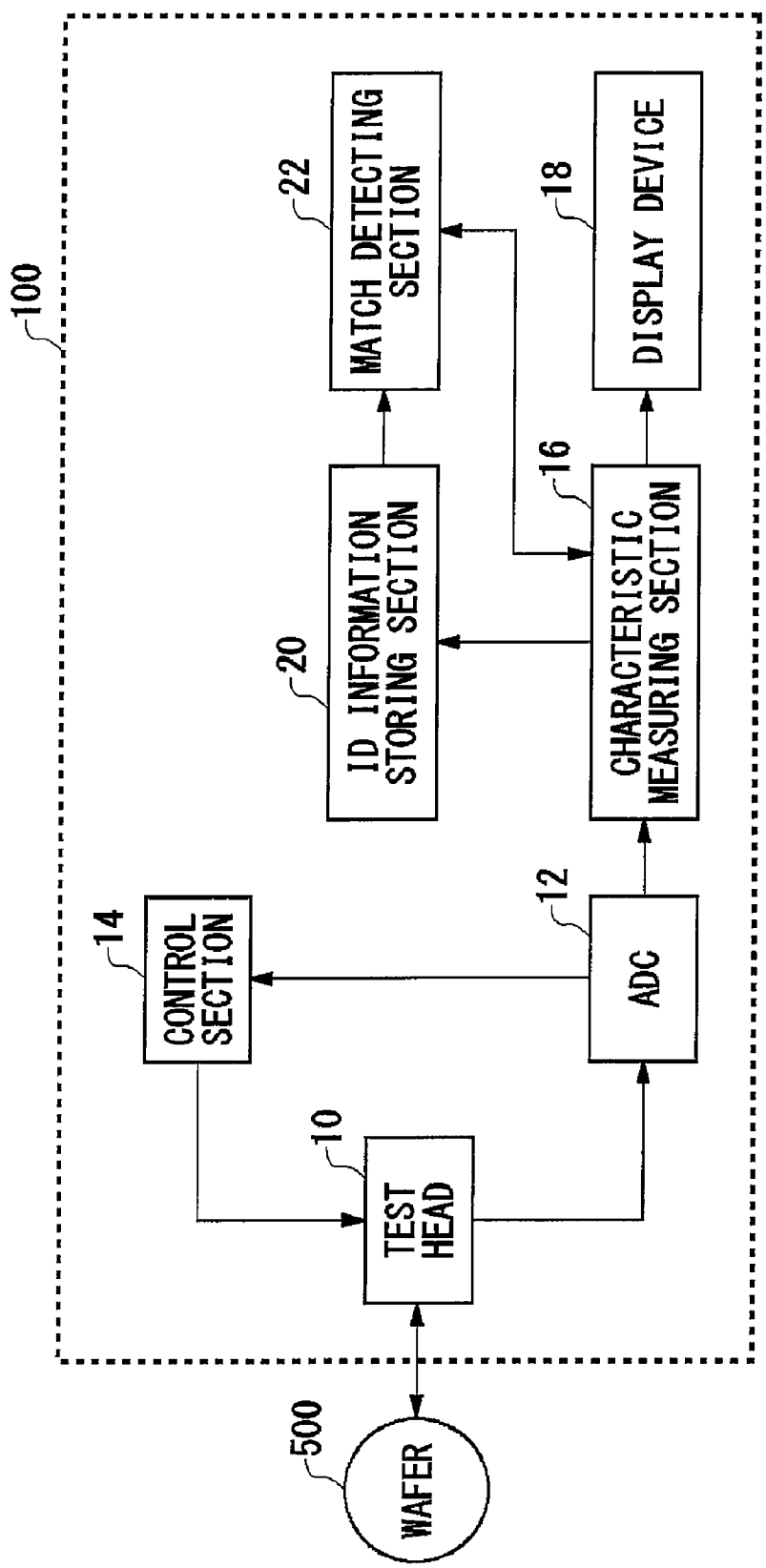
FIG. 1 illustrates the configuration of a measuring apparatus 100 relating to an embodiment of the present invention.

FIG. 1 illustrates the configuration of a measuring apparatus 100 relating to an embodiment of the present invention. The measuring apparatus 100 is designed to measure the electrical characteristics of a wafer 500 in which a plurality of electronic devices are formed. The measuring apparatus 100 includes therein a test head 10, an ADC 12, a control section 14, a characteristic measuring section 16, a display device 18, an identification information storing section 20, and a match detecting section 22.

The test head 10 is electrically connected to the plurality of electronic devices formed in the wafer 500, so as to transmit/receive signals to/from the test circuits formed within the electronic devices. The control section 14 controls the test circuits in the respective electronic devices via the test head 10. The ADC 12 converts the signals output from the respective test circuits via the test head 10 into digital data.

The characteristic measuring section 16 measures the electrical characteristics of each test circuit based on the digital data output from the ADC 12. For example, the characteristic measuring section 16 measures the electrical characteristics of the test elements included in each test circuit. The test elements are, for example, transistors. The characteristic measuring section 16 measures threshold voltages, current-voltage characteristics, leakage currents and the like of the respective test elements.

The electrical characteristics measured by the characteristic measuring section 16 can be used to judge whether each electronic device is acceptable or not. For example, it is possible to judge whether each electronic device is acceptable or not based on the unevenness of the electrical characteristics among the test elements included in each electronic device.

The display device 18 displays thereon the electrical characteristics of the respective test elements. For example, the display device 18 displays characteristics information indicating the voltage value of the threshold voltage of each test element at the coordinates corresponding to the same test element on the display surface thereof.

The identification information storing section 20 stores thereon, in association with each electronic device, the electrical characteristics of the test elements provided in the electronic device, as the identification information of the electronic device. For example, the identification information storing section 20 compares the values indicating the electrical characteristics of the respective test elements with a predetermined reference value, and stores thereon the result of the comparison as the identification information. Here, the identification information storing section 20 may store thereon the identification information of each electronic device in association with the lot number of the wafer 500, the identification number of the wafer 500 (for example, the serial number of the wafer 500), the position of the electronic device within the wafer 500, the values indicating the electrical characteristics measured by the characteristic measuring section 16 and the like. The characteristic measuring section 16 preferably measures the electrical characteristics of the test elements to generate identification information of each electronic device and store the generated identification information onto the identification information storing section 20 while the plurality of electronic devices are formed in the same wafer 500.

With the above-described configurations, the measuring apparatus 100 can obtain information representing the identification of each electronic device. Since the measuring apparatus 100 stores thereon, as the identification information of each electronic device, the electrical characteristics of the test elements provided in the electronic device originally for evaluating the characteristics of the electronic device, each electronic device does not need a structure dedicated to provide the identification information. As a result, the present embodiment can improve the area efficiency, the manufacturing efficiency and the like of the electronic devices.

The measuring apparatus 100 stores thereon the identification information of each electronic device in association with the manufacturing history of the electronic device such as the lot number of the electronic device and the position of the electronic device on the wafer 500. The measuring apparatus 100 may measure the electrical characteristics of the test circuit included in each electronic device at a plurality of timings during the electronic device manufacturing process. The measuring apparatus 100 may store the electrical characteristics measured in this manner in association with the identification information of the electronic device. With the above-described configurations, when a given electronic device experiences defects, failures or the like, the measuring apparatus 100 detects the identification information of the given electronic device, and compares the detected identification information with prestored pieces of identification information, so as to be capable of investigating the manufacturing history of the given electronic device which experiences the defects or the like. As a consequence, the present embodiment makes it possible to analyze the defects or failures in detail.

For example, when a given electronic device experiences defects, failures or the like after the wafer 500 is cut into separate electronic devices, the measuring apparatus 100 measures the electrical characteristics of the test circuit of the given electronic device. To do this, the measuring apparatus 100 operates in the same manner as when measuring the electrical characteristics of the electronic devices which have not been separated from each other by the cutting of the wafer 500. For example, the characteristic measuring section 16 measures the electrical characteristics of the plurality of test elements included in the test circuit of the given electronic device. With the use of the measured electrical characteristics, the characteristic measuring section 16 obtains the identification information of the given electronic device.

The match detecting section 22 compares the identification information obtained by the characteristic measuring section 16 with the plurality of pieces of identification information prestored on the identification information storing section 20, and detects whether the obtained identification information matches any of the pieces of identification information. When the obtained identification information matches any of the pieces of identification information, the match detecting section 22 judges that the given electronic device is the same as the electronic device associated with the matching identification information. With the above-described configuration, the measuring apparatus 100 can obtain the identification of the given electronic device and therefore investigate the manufacturing history of the given electronic device, even after the wafer 500 is cut into the individual electronic devices.

For example, in a case where an electronic device experiences failures or other problems after distributed into the market and used, the supplier of the electronic device recalls the electronic device and analyzes the failures. For this analysis, it is necessary to investigate the manufacturing history of the electronic device. The measuring apparatus 100 relating to the present example can easily conduct an investigation into the manufacturing history of the electronic device with reference to the identification information of the electronic device. Since the test circuit provided in the electronic device does not operate during the actual operation of the electronic device, the electrical characteristics of the test elements included in the test circuit vary only slightly. For this reason, the measuring apparatus 100 can acquire accurate identification of the electronic device.

Figure 2:
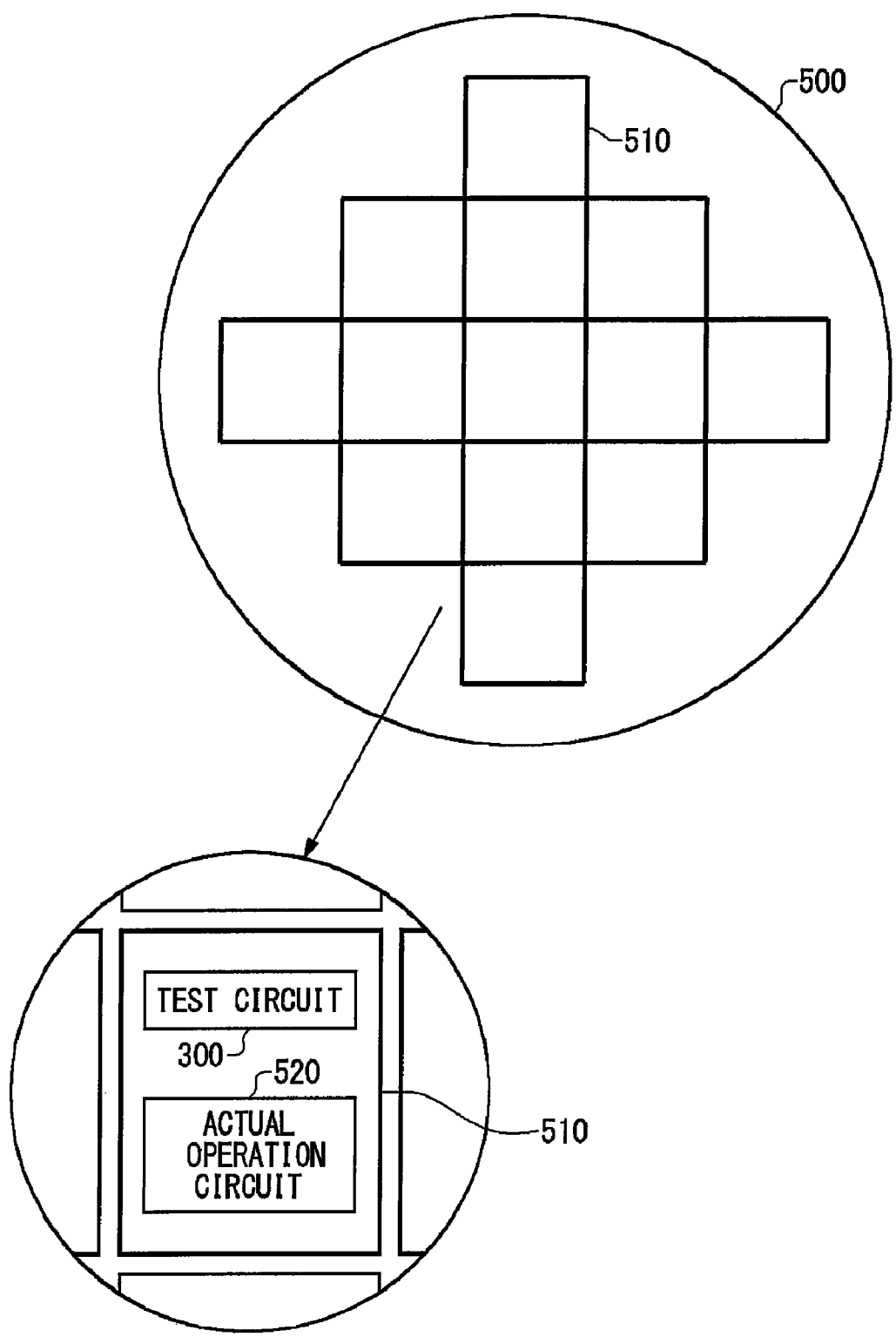
FIG. 2 illustrates, as an example, an electronic device 510 formed in a wafer 500.

FIG. 2 illustrates, as an example, an electronic device 510 formed in the wafer 500. As illustrated in FIG. 2, the wafer 500 has a plurality of electronic devices 510 formed therein. Each of the electronic devices 510 is a device including therein a semiconductor circuit, for example.

The electronic device 510 includes therein an actual operation circuit 520 and a test circuit 300. The actual operation circuit 520 operates during the actual operation of the electronic device 510, and the test circuit 300 operates during the test of the electronic device 510. Testing the electronic device 510 includes acquiring the identification information of the electronic device 510. The test circuit 300 has a plurality of test elements formed therein. For example, the test circuit 300 may have a plurality of transistors formed therein as the test elements.

Figure 3:
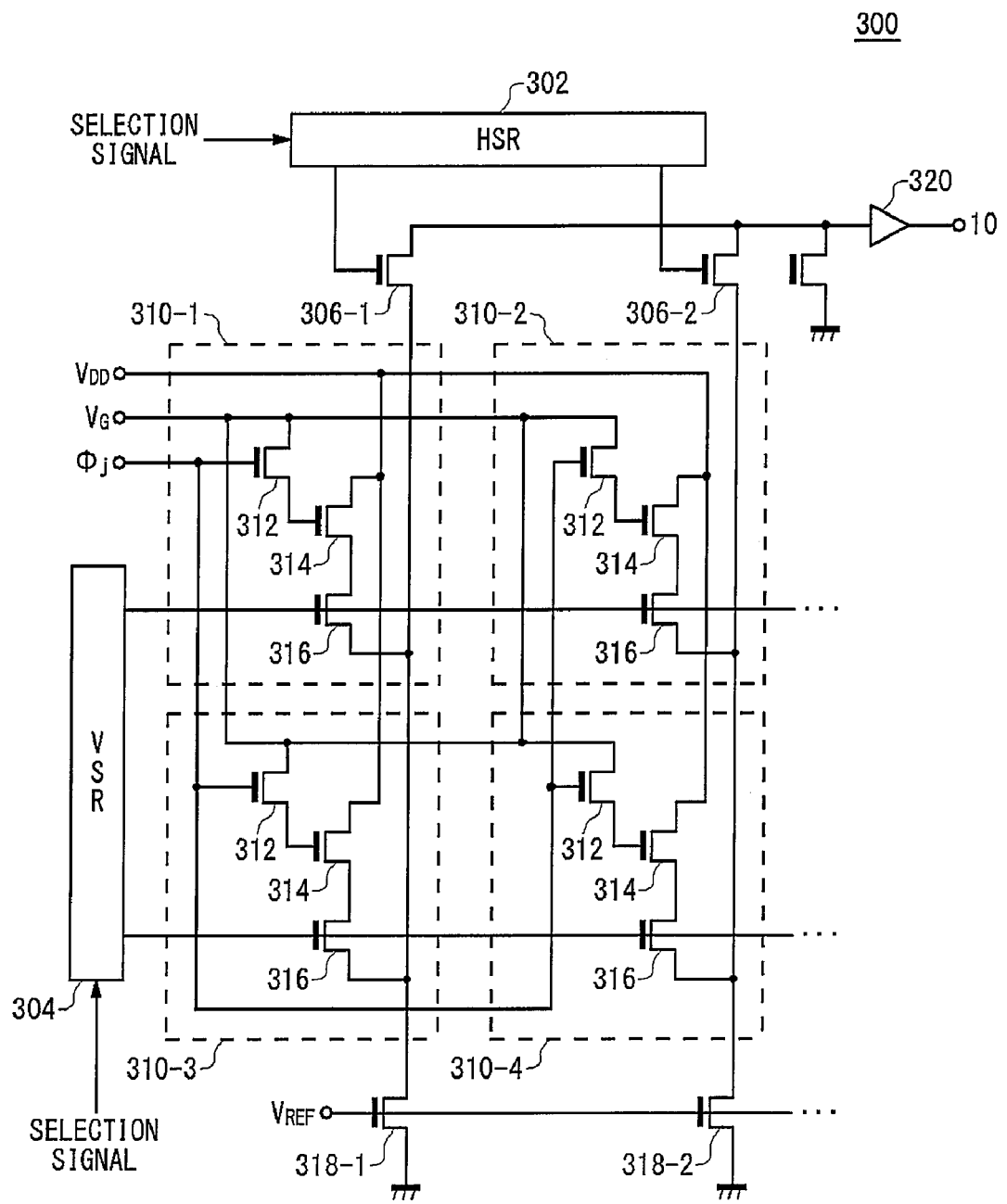
FIG. 3 illustrates an exemplary configuration of a test circuit 300.

FIG. 3 illustrates an exemplary configuration of the test circuit 300. The test circuit 300 includes therein a column selecting section 302, a row selecting section 304, a plurality of column selecting transistors (306-1 and 306-2, hereinafter referred to as column selecting transistors 306), a plurality of current sources (318-1 and 318-2, hereinafter referred to as current sources 318), an output section 320, and a plurality of cells (310-1 to 310-4, hereinafter referred to as cells 310). The column selecting transistors 306 and current sources 318 are provided in a one-to-one correspondence with a plurality of cell groups (each including a plurality of cells 310) which are arranged adjacent to each other in the row direction.

The plurality of cells 310 are arranged in a matrix of rows and columns within the surface of the wafer 500 in such a manner that the cells 310 are connected to each other in parallel. In the exemplary circuitry shown, two cells 310 are provided in the row and column directions respectively. However, the numbers of the cells 310 provided in the row and column directions can be increased. For example, the test circuit 300 has the cells 310 arranged in the 128 columns adjacent to each other in the row direction and 512 rows adjacent to each other in the column direction.

Each of the cells 310 includes a test element 314, a switching transistor 312, and a row selecting transistor 316. The transistors provided in each cell 310 may be MOS transistors which are formed in the same process as the actual operation transistors provided in the actual operation circuit 520 in the electronic device 510.

The test elements 314 of the respective cells 310 are electrically in parallel with each other. Each test element 314 is supplied with a predetermined voltage $V_{DD}$ at the drain terminal thereof. The terminal of each test element 314 to which the well voltage is supplied is not illustrated in FIG. 3, but may be connected to the ground potential. Alternatively, with the well voltage of each transistor being configured so as to be independently controlled, the well voltage terminal and the source terminal of each test element 314 may be connected to each other. Each test element 314 may be an NMOS or PMOS transistor. The voltages $V_{DD}$, $V_G$, $\phi_j$, and $V_{REF}$ shown in FIG. 4 may be supplied to the test circuit 300 from the control section 14 shown in FIG. 1.

The switching transistor 312 of each cell 310 is provided in correspondence with the test element 314 in the same cell 310. The switching transistor 312 of each cell 310 applies a predetermined gate voltage to the gate terminal of the corresponding test element 314. In the present example, each switching transistor 312 is supplied with the predetermined voltage $V_G$ at the drain terminal thereof, supplied with the voltage $\phi_j$ that controls the operation of the switching transistor 312 at the gate terminal thereof, and connected to the gate terminal of the corresponding test element 314 at the source terminal thereof. Which is to say, when turned on by the voltage $\phi_j$, the switching transistor 312 applies a voltage substantially equal to the voltage $V_G$ to the gate terminal of the test element 314. When turned off by the voltage $\phi_j$, the switching transistor 312 applies a fluctuating voltage whose initial voltage is substantially equal to the voltage $V_G$ to the gate terminal of the test element 314.

In the example shown in FIG. 3, the voltage $\phi_j$ is concurrently applied to all of the cells 310. According to a different example, however, the voltage $\phi_j$ may be sequentially applied from the row selecting section 304 to each group of cells 310 which are arranged adjacent to each other in the row direction in the form of a pulse signal. This alternative application method aims to achieve the same duration for the measurement of the P-N junction leakage current among all the cells 310.

The row selecting transistor 316 in each cell 310 is provided in correspondence with the test element in the same cell. In the present example, each row selecting transistor 316 is connected to the source terminal of the corresponding test element 314 at the drain terminal thereof. The source terminal of each row selecting transistor 316 is connected to the source terminal of the corresponding column selecting transistor 306. In other words, the source terminal of each column selecting transistor 306 is connected to the source terminals of the corresponding plurality of row selecting transistors 316.

The row selecting section 304 sequentially selects a plurality of cell groups each of which is constituted by a plurality of cells 310 arranged adjacent to each other in the row direction (in the present example, the cell group including the cells 310-1 and 310-2 and the cell group including the cells 310-3 and 310-4). The column selecting section 302 sequentially selects a plurality of cell groups each of which is constituted by a plurality of cells 310 arranged adjacent to each other in the column direction (in the present example, the cell group including the cells 310-1 and 310-3 and the cell group including the cells 310-2 and 310-4). Being configured in the above-described manner, the row selecting section 304 and the column selecting section 302 together sequentially select the individual cells 310.

According to the present example, the row selecting section 304 turns on the row selecting transistors 316 provided in the cells 310 forming the cell group corresponding to the row designated by the selection signal supplied to the row selecting section 304 from the control section 14. The column selecting section 302 turns on the column selecting transistor 306 provided in correspondence with the cell group corresponding to the column designated by the selection signal supplied to the column selecting section 302 from the control section 14. The control section 14 supplies the selection signals configured to sequentially select the individual cells 310 to the row selecting section 304 and column selecting section 302. The column selecting section 302 and row selecting section 304 may be circuits such as a decoder and a shift register which convert the selection signals supplied thereto into position signals indicating the position of a cell 310 to be selected. Here, the position signals are designed to turn on the column selecting transistor 306 and the row selecting transistor 316, which correspond to the cell 310 to be selected in accordance with the selection signals.

With the above-described configuration, the measuring apparatus 100 sequentially selects the test element 314 provided in each cell 310. As a result, the source voltage of the selected test element 314 is sequentially supplied to the output section 320. The output section 320 sequentially outputs the source voltage supplied thereto to the test head 10. The output section 320 is a voltage follower buffer, for example. By using the source voltage of each test element 314, the measuring apparatus 100 measures the electrical characteristics of the test element 314, such as the threshold voltage, the current-voltage characteristics, low-frequency noise, and P-N junction leakage current.

Each current source 318 is a MOS transistor which receives at the gate terminal thereof the predetermined voltage $V_{REF}$. The drain terminal of each current source 318 is connected to the source terminals of the corresponding row selecting transistors 316. In other words, each current source 318 is provided in correspondence with a plurality of test elements 314 which are all positioned at substantially the same position in the row direction, and defines the source-drain currents flowing through the corresponding test elements 314.

According to the test circuit 300 having the circuit structure shown in FIG. 3, each of the plurality of test elements 314 is sequentially selected electrically, and the source voltage of the selected test element 314 can be sequentially output. Therefore, the source voltages of the respective test elements 314 can be measured at high speed within a short time. Consequently, even when a large number of test elements 314 are formed in the wafer 500, the electrical characteristics of all the test elements 314 can be measured within a short time. In the present example, the number of test elements 314 provided within the surface of the wafer 500 may reach approximately 10,000 to 10,000,000. By measuring the electrical characteristics of such a large number of test elements 314, the present embodiment can accurately calculate the unevenness of the characteristics among the test elements 314.

Figure 4:
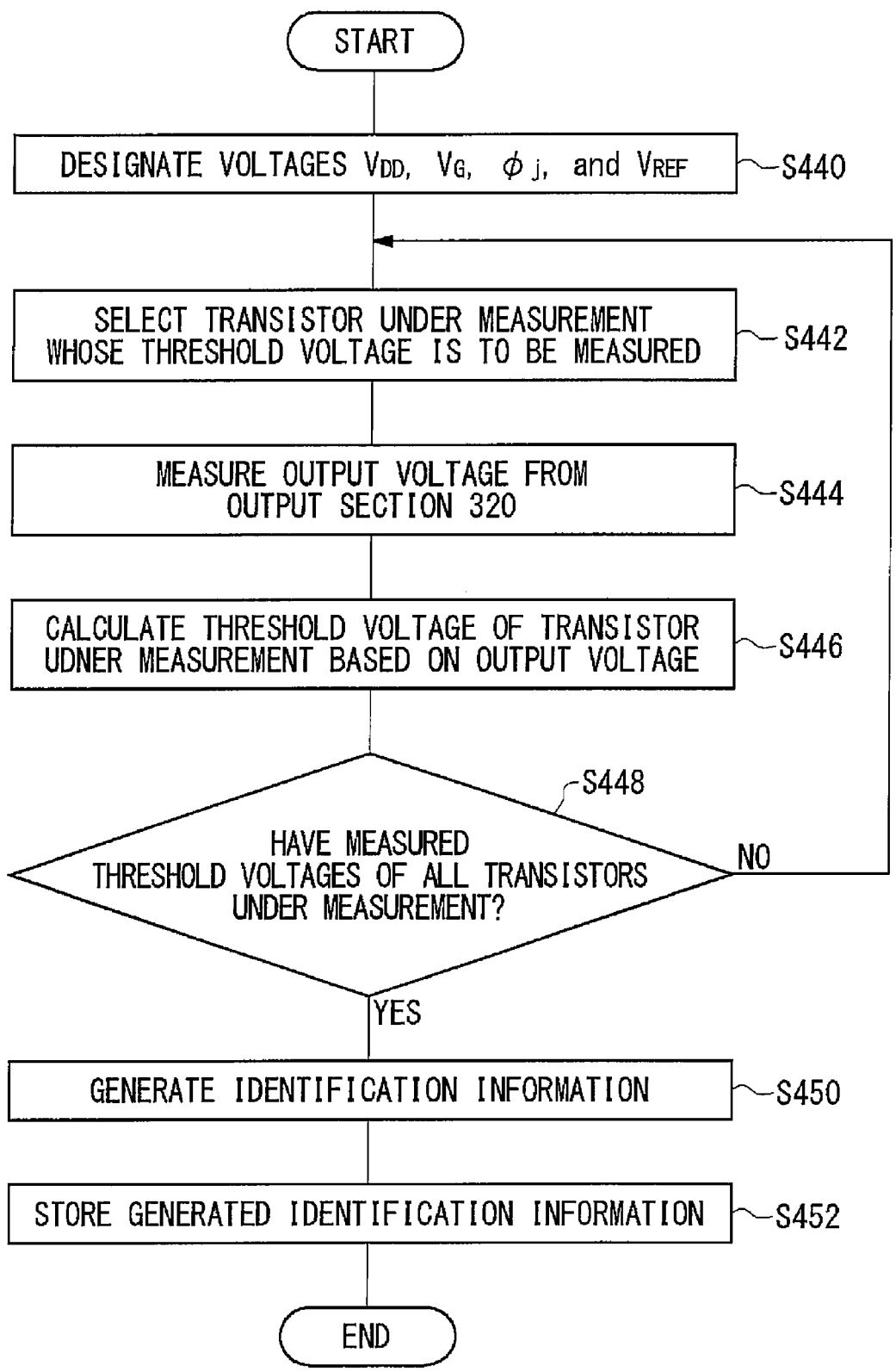
FIG. 4 is a flow chart illustrating an exemplary device identifying method according to which the threshold voltages of respective test elements 314 are measured to generate identification information of each electronic device 510.

FIG. 4 is a flow chart illustrating an exemplary device identifying method according to which the threshold voltages of the respective test elements 314 are measured to generate the identification information of each electronic device 510. The device identifying method includes a characteristics measuring step (step S440 to S448), an identification information generating step S450, and an identification information storing step S452.

The control section 14 supplies the voltages $V_{DD}$, $V_G$, $\phi_j$, and $V_{REF}$ described with reference to FIG. 3 to the test circuit 300 (step S440). To be specific, the control section 14 supplies the constant voltage $V_{REF}$ to each current source 318, and causes each current source 318 to generate the same constant current. The control section 14 also supplies the gate voltage $V_G$ to turn on the test elements 314, and supplies the voltage $\phi_j$ to turn on the switching transistors 312. As a result of the above controls by the control section 14, each test element 314 is supplied at the gate terminal thereof with the gate voltage to turn on the test element 314.

After this, the control section 14 supplies the selection signals to select a test element 314 whose threshold voltage is to be measured, to the column selecting section 302 and the row selecting section 304 (step S442). The ADC 12 then measures the output voltage from the output section 320 (step S444). The ADC 12 may notify the control section 14 that the output voltage has been measured. When receiving the notification, the control section 14 may select the next test element 314.

Subsequently, the characteristic measuring section 16 calculates the threshold voltage of the test element 314 based on the gate voltage $V_G$ applied to the test element 314 and the output voltage from the output section 320 (step S446). The threshold voltage of the test element 314 can be obtained, for example, by calculating the difference between the gate voltage $V_G$ and the output voltage, that is to say, the gate-source voltage of the test element 314.

After this, the control section 14 judges whether the characteristic measuring section 16 has measured the threshold voltages of all the test elements 314 (step S448). When there are test elements 314 whose threshold voltages have not been measured, the control section 14 selects the next test element 314. Following this, the operations in the steps S444 and S446 are repeated. When having calculated the threshold voltages of all of the test elements 314, the characteristic measuring section 16 generates the identification information of the electronic device 510 based on the threshold voltages of the respective test elements 314. The identification information storing section 20 then stores thereon the generated identification information of the electronic device 510 (step S452).

By operating in the above-described manner, the measuring apparatus 100 can generate the identification information of each electronic device 510 and store thereon the generated identification information. Since the measuring apparatus 100 generates the identification information based on the electrical characteristics of the test circuit 300 which is used for testing the electronic device 510, the identification of each electronic device 510 can be obtained without additional means in the electronic device 510 for storing thereon the identification information.

FIG. 5 illustrates, as an example, the identification information of each electronic device 510 stored on the identification information storing section 20. The characteristic measuring section 16 generates the identification information based on the electrical characteristics of the test elements 314 arranged in a matrix, for example, as shown in FIG. 3. The characteristic measuring section 16 may generate the identification information based on the result of comparing the values indicating the electrical characteristics (e.g. the threshold voltages) of the respective test elements 314 with a predetermined reference value. For example, the characteristic measuring section 16 generates identification information in which 0s and 1s are arranged in a matrix as illustrated in FIG. 5, where "0" indicates that the value indicating the electrical characteristic of a test element 314 is smaller than the reference value and "1" indicates that the value indicating the electrical characteristic of a test element 314 is larger than the reference value. There are alternative methods other than the above method in which the values indicating the electrical characteristics are compared with the reference value to obtain binary values. For example, the values indicating the electrical characteristics themselves may be stored as the identification information, or the characteristic of the pattern formed by the values indicating the electrical characteristics may be extracted and stored as the identification information. For example, the characteristic of the pattern may be extracted by converting the values indicating the electrical characteristics into the binary values as described above. Alternatively, the characteristic of the two-dimensional pattern formed by the values indicating the electrical characteristics of the test elements 314 may be extracted. The identification information may be stored in the state of being data-compressed.

Since the identification information of each electronic device 510 is generated based on the electrical characteristics of a large number of test elements 314, different identification information can be generated in association with each electronic device 510. The identification information storing section 20 may store thereon the identification information in the compressed form. For example, the identification information storing section 20 may store thereon the positions in the matrix of the identification information at which the data value is "0" (in the present example, [X1, Y3], [X3, Y1] and [X4, Y3]).

Figure 6:
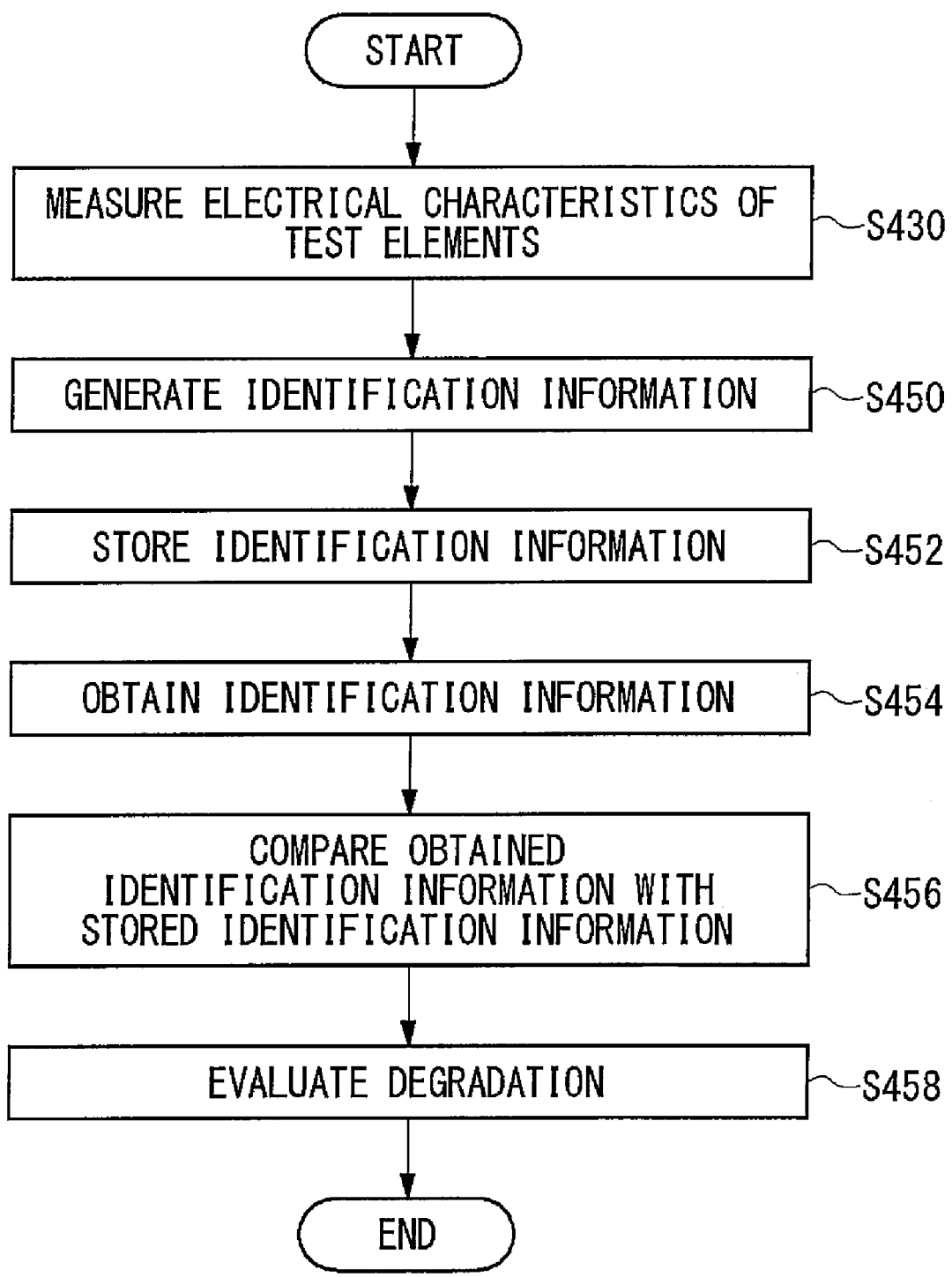
FIG. 6 is a flow chart illustrating an exemplary evaluating method for evaluating degradation of each electronic device 510.

FIG. 6 is a flow chart illustrating an exemplary evaluating method for evaluating the degradation of each electronic device 510. The step S430 in FIG. 6 of measuring the electrical characteristics of the test elements can be performed, for example, by the sequence of the steps S440 to S448 described with reference to FIG. 4. The operations performed in the steps S450 and S452 in FIG. 6 are respectively the same as the operations performed in the steps S450 and S452 described with reference to FIG. 5.

To evaluate a given electronic device 510, the electrical characteristics of the test elements 314 provided in the given electronic device 510 are measured, so that the identification information is obtained for the given electronic device 510 (the identification information obtaining step S454). Here, the given electronic device 510 is, for example, one of the plurality of electronic devices 510 which are obtained by cutting the wafer 500.

After this, the obtained identification information is compared with the identification information stored on the identification information storing section 20. When the obtained identification information matches the stored identification information, the given electronic device 510 is judged to be the same as the electronic device 510 associated with the identification information stored on the identification information storing section 20 (the matching step S456). When the obtained identification information matches the stored identification information in the matching step S456, the degradation of the given electronic device 510 is evaluated with reference to the difference between the electrical characteristics measured in the characteristic measuring step S430 and the electrical characteristics measured in the identification information obtaining step S454 (the evaluating step S458). In the above-described manner, the degradation of each electronic device 510 can be evaluated.

The test elements 314 provided in each electronic device 510 are divided into a plurality of groups. The groups of test elements 314 may differ from each other in terms of the process rule, device size, configuration, and orientation. In this case, it is possible to evaluate the degradation of the devices of, for example, different device sizes provided in the actual operation circuit of each electronic device 510.

Figure 7A:
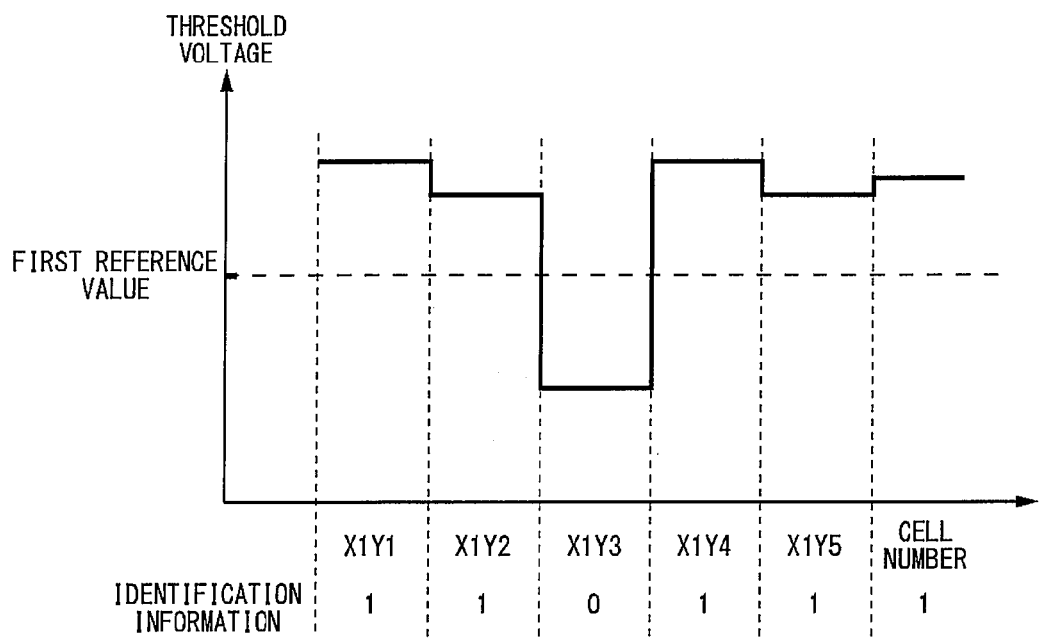
FIGS. 7A and 7B illustrate exemplary methods used by a characteristic measuring section 16 to generate the identification information of each electronic device 510, where
Figure 7B:
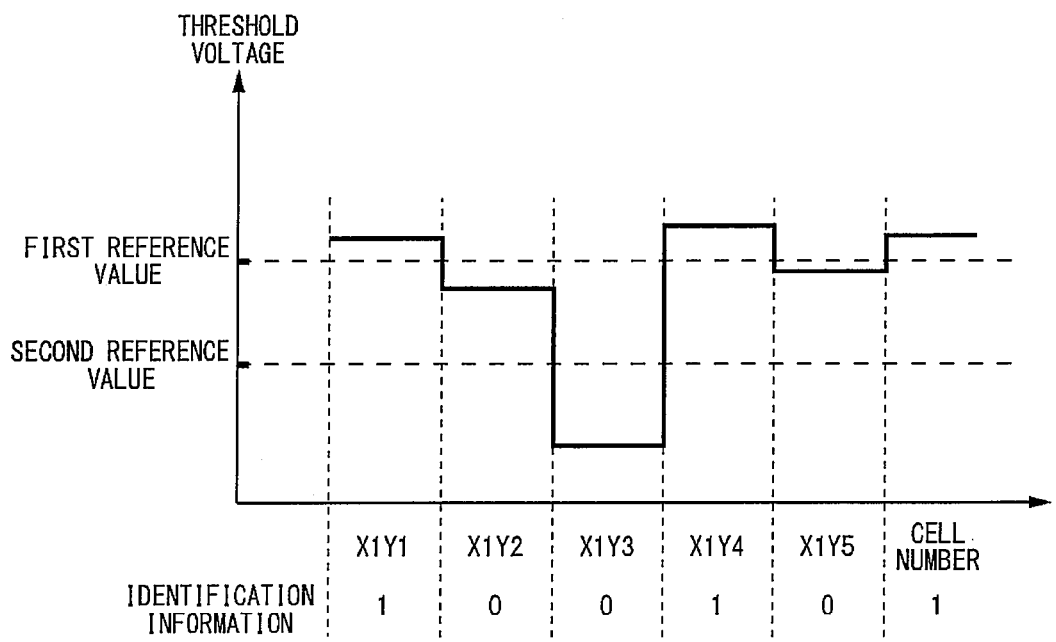

FIGS. 7A and 7B illustrate exemplary methods used by the characteristic measuring section 16 to generate the identification information of each electronic device 510. FIG. 7A illustrates a method used when the plurality of electronic devices 510 are formed in the same wafer 500 to generate the identification information of each electronic device 510, and FIG. 7B illustrates a method used after the wafer 500 is cut into the separate electronic devices 510 to generate the identification information of each electronic device 510.

As illustrated in FIG. 7A, the characteristic measuring section 16 generates the identification information based on the result of comparing the threshold voltage of the test element 314 provided in each cell 310 with a predetermined first reference value. As mentioned above, the characteristic measuring section 16 generates the identification information which is the matrix of 0s and 1s where "1" indicates that the threshold voltage of each test element 314 is larger than the first reference value and "0" indicates that the threshold voltage of each test element 314 is smaller than the first reference value. The identification information storing section 20 stores thereon the identification information.

To evaluate degradation of a given electronic device 510 recalled from, for example, a market, a user or the like, the characteristic measuring section 16 obtains identification information of the given electronic device 510 based on the result of comparing the threshold voltage of the test element 314 provided in each cell 310 of the given electronic device 510 with a predetermined second reference value, as illustrated in FIG. 7B.

Depending on, for example, how the electronic device 510 has been used, the threshold voltages of the test elements 314 may have degraded. If such is the case, the comparison of the threshold voltages of the test elements 314 with the first reference value may produce erroneous identification information, as illustrated in FIG. 7B.

According to the present example, the characteristic measuring section 16 compares the threshold voltages of the test elements 314 with the second reference value which is different from the first reference value. For example, when obtaining the identification information of the electronic device 510 based on the electrical characteristic which tends to decrease as the electronic device 510 is more used, the characteristic measuring section 16 obtains the identification information by using the second reference value which is set lower than the first reference value.

The characteristic measuring section 16 may determine the second reference value with reference to the threshold voltages which are measured to generate the identification information that has been stored on the identification information storing section 20. For example, the characteristic measuring section 16 detects one or more threshold voltages lower than the first reference value from among the threshold voltages measured to generate the identification information that has been stored on the identification information storing section 20, and determine the second reference value based on the highest threshold voltage among the detected threshold voltages. For example, the characteristic measuring section 16 may add a predetermined value to the highest threshold voltage and use the resulting value as the second reference value. Here, the predetermined value is set so that the resulting value does not exceed the first reference value. Referring to the exemplary case shown in FIG. 7A, the characteristic measuring section 16 may add the predetermined value to the threshold voltage of the test element 314 with the cell number X1Y3, and use the resulting value as the second reference value. In the above-described manner, the characteristic measuring section 16 can detect accurate identification information of the electronic device 510 even when the characteristics of the electronic device 510 have degraded due to the use of the electronic device 510.

Figure 8:
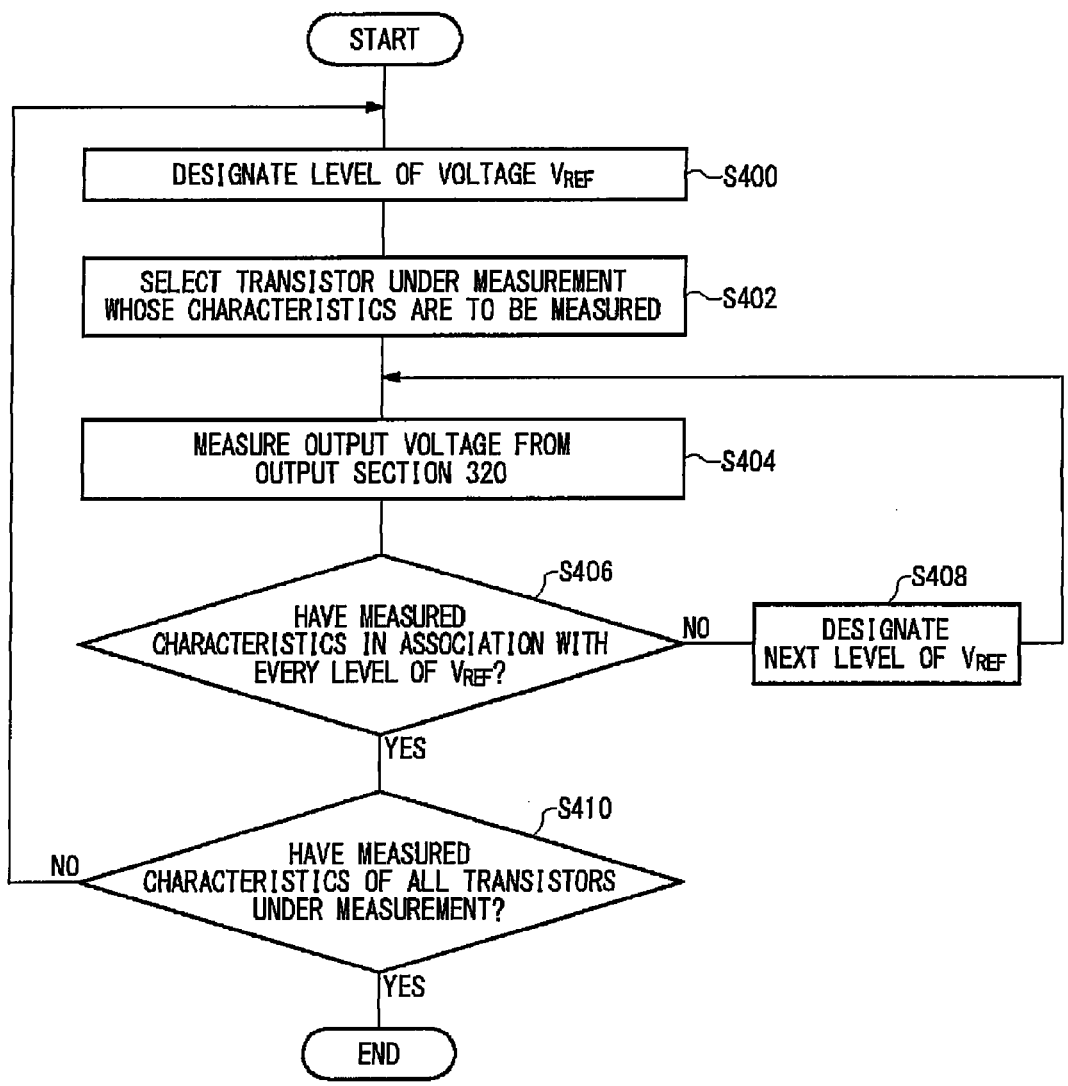
FIG. 8 is a flow chart illustrating an exemplary device identifying method according to which the current-voltage characteristics of the respective test elements 314 are measured to generate the identification information of each electronic device 510.

FIG. 8 is a flow chart illustrating an exemplary device identifying method according to which the current-voltage characteristics of the respective test elements 314 are measured to generate the identification information of each electronic device 510. The sequence of the steps S400 to S410 in FIG. 8 can be conducted as the characteristic measuring step S430 illustrated in FIG. 6.

The control section 14 supplies the voltages $V_{DD}$, $V_G$, $\phi_j$ and $V_{REF}$ explained with reference to FIG. 3 to the test circuit 300 (step S400). Specifically speaking, the control section 14 supplies the constant voltage $V_{REF}$ to each current source 318, and causes each current source 318 to generate the same constant current. The control section 14 supplies the gate voltage $V_G$ to turn on the test elements 314, and supplies the voltage $\phi_j$ to turn on the switching transistors 312.

After this, the control section 14 supplies the selection signals to select a test element 314 whose current-voltage characteristic is to be measured, to the column selecting section 302 and the row selecting section 304 (step S402). The control section 14 then varies the voltage $V_{REF}$ within a predetermined range with a predetermined resolution (steps S406 to S408). While the voltage $V_{REF}$ is varied, the ADC 12 measures the output voltage from the output section 320 in association with each level of the voltage $V_{REF}$ (step S404). In other words, the measuring apparatus 100 sequentially varies the source-drain current generated by each current source 318, and measures the source voltage of the selected test element 314 in association with each level of the source-drain current. In the above-described manner, the measuring apparatus 100 can measure the current-voltage characteristic of the selected test element 314.

The measuring apparatus 100 judges whether the current-voltage characteristics of all the test elements 314 have been measured (step S410). When there are one or more test elements 314 whose current-voltage characteristics have not been measured, the measuring apparatus 100 repeats the sequence of the steps S400 to S410. Note that, in the step S402, the measuring apparatus 100 selects the next test element 314. When having measured the current-voltage characteristics of all the test elements 314, the characteristic measuring section 16 generates the identification information of the electronic device based on the measured current-voltage characteristics. For example, the characteristic measuring section 16 may generate the identification information by using the gradient of each current-voltage characteristic, mutual conductance gm of each test element 314 or the like.

Figure 9:
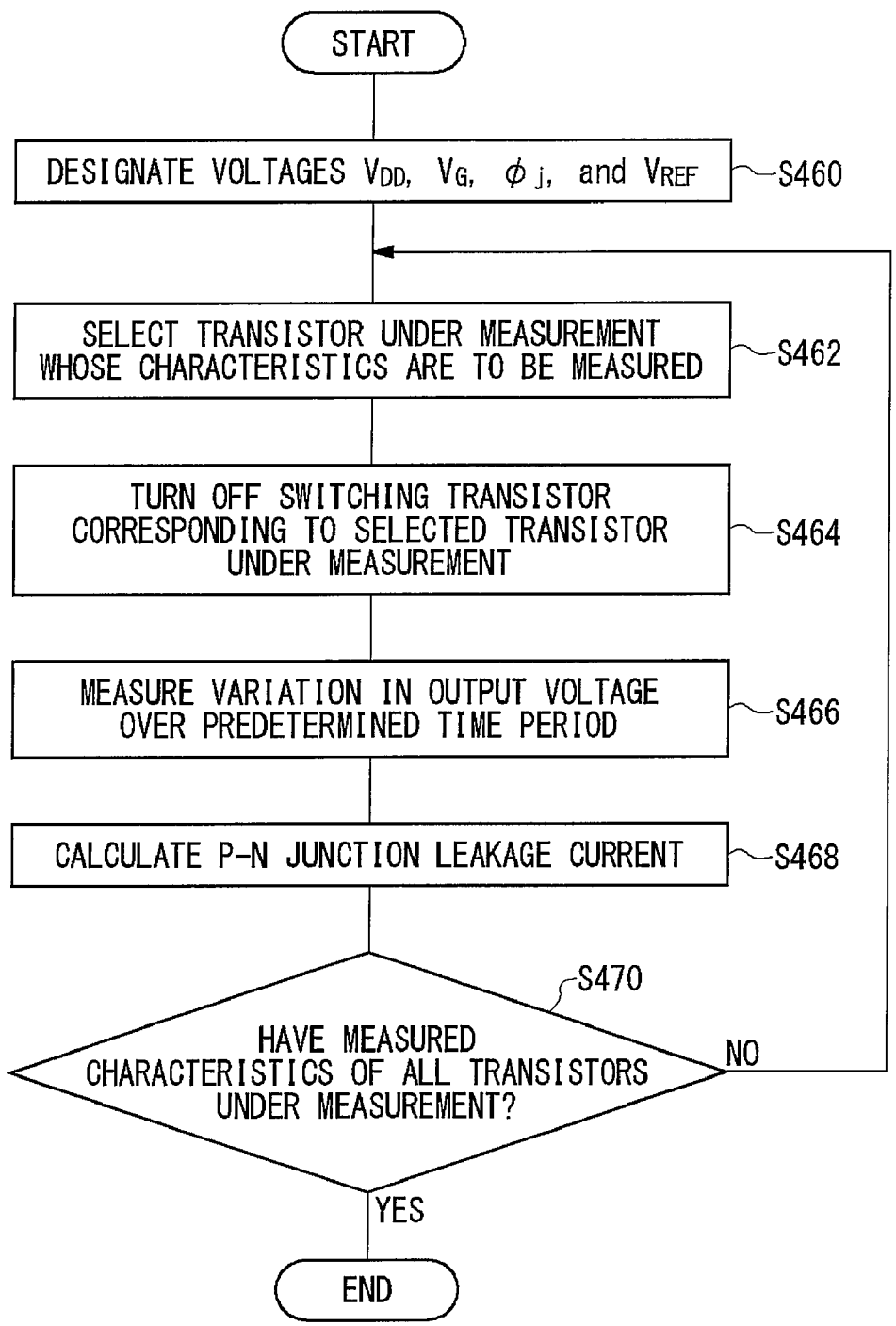
FIG. 9 is a flow chart illustrating an exemplary device identifying method according to which the P-N junction leakage currents of the respective test elements 314 are measured to generate the identification information of each electronic device 510.

FIG. 9 is a flow chart illustrating an exemplary device identifying method according to which the P-N junction leakage currents of the respective test elements 314 are measured to generate the identification information of each electronic device 510. The sequence of the steps S460 to S470 in FIG. 9 can be conducted as the characteristic measuring step S430 explained with reference to FIG. 6. Here, each switching transistor 312 has a P-N junction connected to the gate terminal of the corresponding test element 314. In the present example, the measuring apparatus 100 measures the leakage current at such a P-N junction.

The control section 14 supplies the voltages $V_{DD}$, $V_G$, $\phi_j$ and $V_{REF}$ explained with reference to FIG. 3 to the test circuit 300 (step S460). Specifically speaking, the control section 14 supplies the constant voltage $V_{REF}$ to each current source 318, and causes each current source 318 to generate the same constant current. The control section 14 supplies the gate voltage $V_G$ to turn on the test elements 314, and supplies the voltage $\phi_j$ to turn on the switching transistors 312. The measuring apparatus 100 causes the row selecting section 304 to sequentially supply a pulse signal to each group of cells 310 which are arranged adjacent to each other in the row direction, to achieve the same duration for the leakage current measuring period among all the cells.

After this, the control section 14 supplies the selection signals to select a test element 314 whose P-N junction leakage current is to be measured, to the column selecting section 302 and the row selecting section 304 (step S462). Subsequently, the control section 14 turns off the switching transistor 312 corresponding to the selected test element 314 (step S464). In other words, the control section 14 causes the switching transistor 312 to sequentially apply the gate voltage to turn on the corresponding test element 314 and the gate voltage to turn off the corresponding test element 314, to the corresponding test element 314.

The characteristic measuring section 16 measures the source voltage of the test element 314 when the test element 314 is turned on and when a predetermined time has elapsed after the test element 314 is turned off (step S466). In the present example, the characteristic measuring section 16 measures the variation of the output voltage from the output section 320 over the above-mentioned predetermined time.

Subsequently, the characteristic measuring section 16 calculates the leakage current at the P-N junction based on the measured variation of the source voltage (step S468). When the switching transistor 312 is turned on, the charges corresponding to the gate voltage are accumulated in the gate capacitance of the test element 314. When the switching transistor 312 is turned off, the charges in the gate capacitance are discharged by the leakage current at the P-N junction. Therefore, the leakage current at the P-N junction can be measured in the form of the variation in the source voltage of the test element 314 over the predetermined time.

Subsequently, the measuring apparatus 100 judges whether the P-N junction leakage currents of all the test elements 314 have been measured (step S470). When there are one or more test elements 314 whose P-N junction leakage currents have not been measured, the measuring apparatus 100 repeats the sequence of the steps S462 to S470. Note that, in the step S462, the measuring apparatus 100 selects the next test element 314. When the P-N junction leakage currents of all the test elements 314 have been measured, the characteristic measuring section 16 generates the identification information of the electronic device by using the measured P-N junction leakage currents. For example, the characteristic measuring section 16 generates the identification information of the electronic device based on the current value of the P-N junction leakage current of each test element 314.

Figure 10:
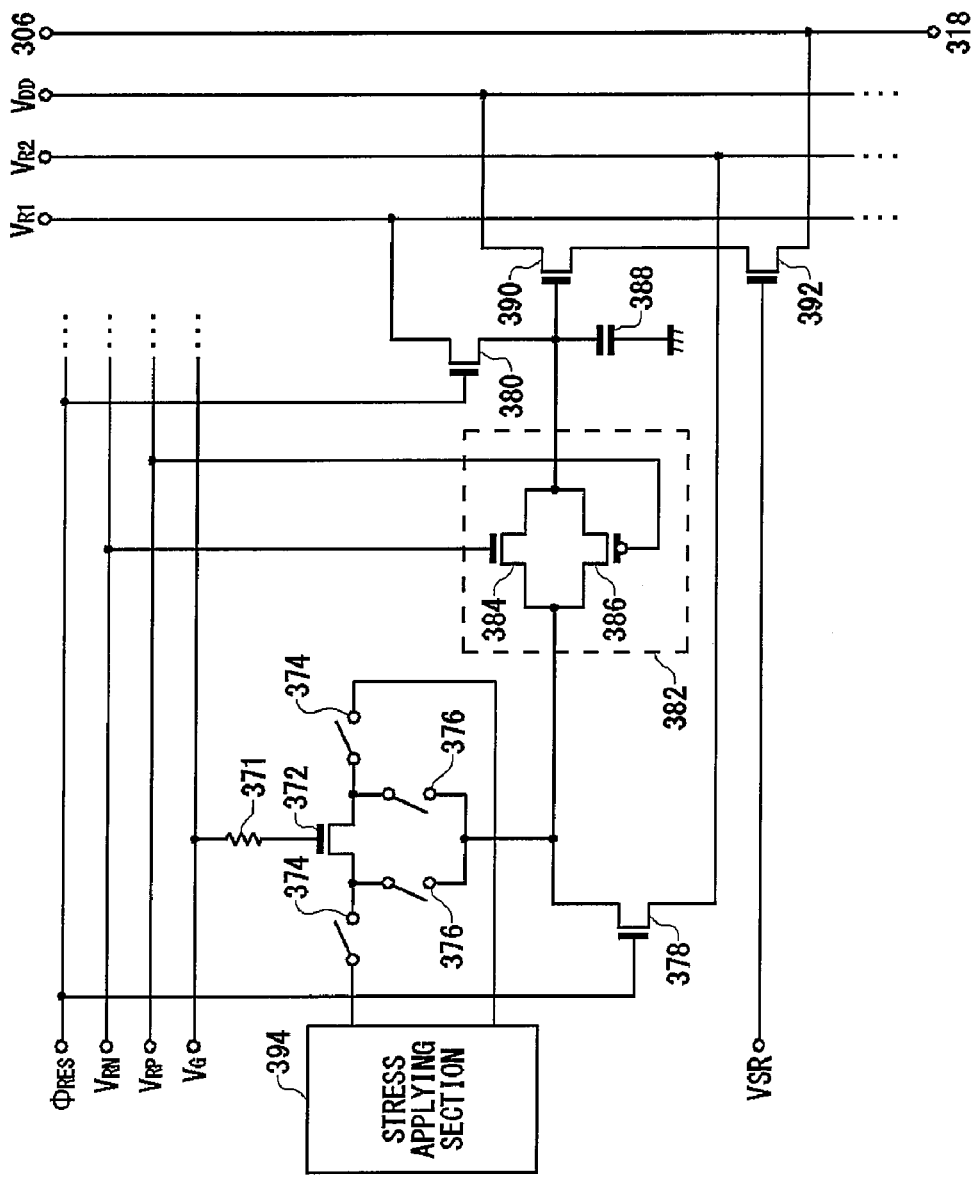
FIG. 10 illustrates a different exemplary configuration of each of the cells 310 provided in each test circuit 300.

FIG. 10 illustrates a different exemplary configuration of each of the cells 310 provided in the test circuit 300. In the test circuit 300 relating to the present example, an electrical stress is applied to a test element 372, and the gate leakage current of the test element 372 charges and discharges an integral capacitance 388, with a constant electric field being applied to the gate insulation film of the test element 372. The measuring apparatus 100 calculates the gate leakage current of the test element 372 with reference to the variation in the voltage value of the integral capacitance 388 over a predetermined time.

Each cell 310 includes a stress applying section 394, a test element 372, a gate voltage control section 371, first switches 374, second switches 376, a voltage applying section 382, an integral capacitance 388, a column selecting transistor 392, reset transistors 378 and 380, and an output transistor 390.

The stress applying section 394 applies an electric stress to the gate insulation film of the test element 372 via the first switches 374. For example, when the test element 372 is assumed to be a storage cell of a flash memory, the stress applying section 394 applies a voltage for data writing and erasing to the test element 372.

When the stress applying section 394 applies the stress to the test element 372, the first switches 374 connect the source and drain terminals of the test element 372 to the stress applying section 394, and the second switches 376 are turned off. In this manner, the stress applying section 394 applies desired voltages to the respective terminals of the test element 372, thereby applying the stress to the test element 372.

According to the present example, the stress applying section 394 applies, to the test element 314, the following four different stresses independently or sequentially.

(1) FN (Fowler-Nordheim) Gate Injection
(2) FN Substrate Injection
(3) Hot Electron Injection
(4) Source Erase According to the above-mentioned stresses (1) to (4), the stress applying section 394 applies the stress to the test element 372 by writing or easing data into/from the test element 372. The stress applying section 394 may apply, to each terminal of the test element 372, the voltage which is to be applied during the actual operation to write or erase data into/from the test element 372. Alternatively, the stress applying section 394 may apply, to each terminal of the test element 372, a voltage higher than the voltage which is to be applied during the actual operation.

The control section 14 supplies a reset signal $\phi_{RES}$, the control voltages $V_{RN}$, $V_{RP}$, $V_{R1}$, $V_{R2}$, and $V_{DD}$, and the gate voltage $V_G$ to the cell 310. The gate voltage control section 371 applies the predetermined gate voltage $V_G$ supplied from the control section 14 to the gate terminal of the test element 372.

The second switches 376 establish or cut off the connection between the source and drain terminals of the test element and the integral capacitance via the voltage applying section 382. The voltage applying section 382 applies a constant voltage to the source and drain terminals of the test element 372 via the second switches 376. When the second switches 376 are turned on, the voltage generated by the voltage applying section 382 is applied to the source and drain terminals of the test element 372. Which is to say, the voltage applying section 382 applies a constant voltage to the source and drain terminals of the test element 372, thereby causing a substantially constant electric field to be applied to the gate insulation film of the test element 372.

The voltage applying section 382 includes a NMOS transistor 384 and a PMOS transistor 386. The NMOS transistor 384 receives the gate voltage $V_{RN}$ corresponding to the voltage to be applied to the source and drain terminals of the test element 372. The NMOS transistor 384 is connected at the source terminal thereof to the source and drain terminals of the test element 372 via the second switches 376, and connected at the drain terminal thereof to the integral capacitance 388. The PMOS transistor 386 is provided in parallel with the NMOS transistor 384, and receives the gate voltage $V_{RP}$ corresponding to the voltage to be supplied to the source and drain terminals of the test element 372. The PMOS transistor 386 is connected at the drain terminal thereof to the source and drain terminals of the test element 372 via the second switches 376, and connected at the source terminal thereof to the integral capacitance 388. The NMOS and PMOS transistors 384 and 386 function to maintain the voltage applied between the gate and the source or between the gate and the drain of the test element 372 at a substantially constant level even if the potential varies as a result of the accumulation of the gate leakage current at the integral capacitance 388.

With the above-described configuration, a constant electric field can be applied to the gate insulation film of the test element 372, and the gate leakage current of the test element 372 can charge and discharge the integral capacitance 388, irrespective of whether the test element 372 is P or N type.

The integral capacitance 388 is charged or discharged by the gate leakage current which is output through the source and drain terminals of the test element 372. The integral capacitance 388 integrates the gate leakage current, and converts the integrated gate leakage current into a voltage value. The reset transistors 378 and 380 initialize the voltage value of the integral capacitance 388 to a predetermined voltage $V_{R1}$ on the reception of the reset signal $\phi_{RES}$ at the gate terminals thereof.

The output transistor 390 receives at the gate terminal thereof the voltage provided by the integral capacitance 388, and outputs the source voltage determined by the received voltage. The column selecting transistor 392 outputs the source voltage from the output transistor 390 to the column selecting transistor 306 in response to the signal from the row selecting section (VSR) 304.

Figure 11:
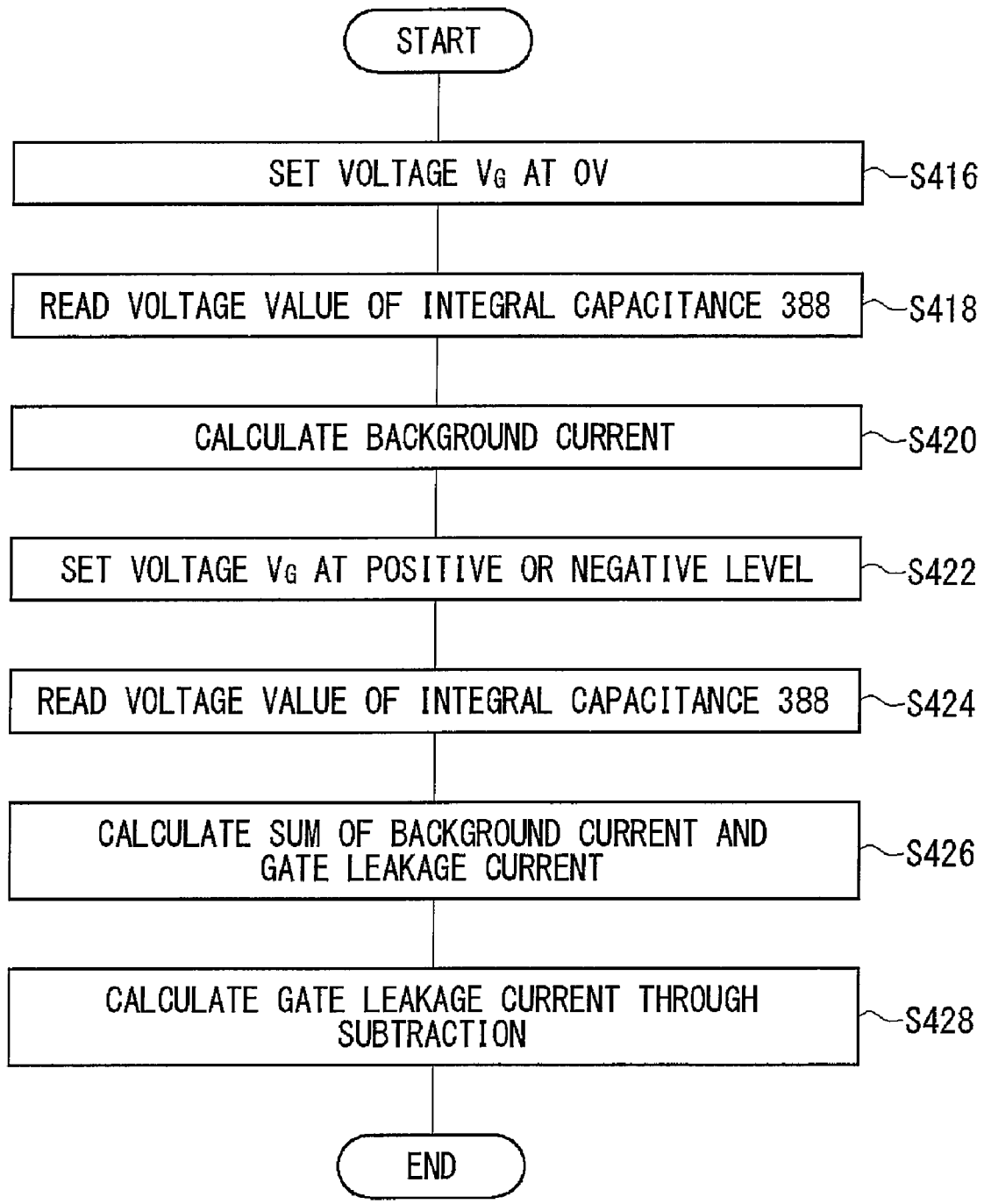
FIG. 11 is a flow chart illustrating an exemplary device identifying method according to which the gate leakage currents of the respective test elements 372 are measured to generate the identification information of each electronic device 510.

FIG. 11 is a flow chart illustrating an exemplary device identifying method according to which the gate leakage currents of the respective test elements 372 are measured to generate the identification information of each electronic device 510. The sequence of the steps from S416 to S428 in FIG. 11 can be conducted as the characteristic measuring step S430 explained with reference to FIG. 6. Prior to the start of the measurement of the gate leakage current of each test element 372, the control section 14 applies an electrical stress to the test element 372 of each cell 310.

For the stress application, the control section 14 turns on the first switches 374 and turns off the second switches 376. The control section 14 then controls the stress applying section 394 of each cell 310 to apply a stress to the test element 372 in each cell 310. Here, the control section 14 may cause the stress applying section 394 to apply the stresses (1) to (4) mentioned in relation to FIG. 10 independently or sequentially to the test element 372. The control section 14 controls the stress applying section 394 to apply the stress to the test element 372 of each cell 310 substantially concurrently.

After performing the above operations, the control section 14 sequentially selects each test element 372, and measures the gate leakage current of the selected test element 372. The selecting process of the test elements 372 is the same as the selecting process described with reference to FIGS. 5 and 8, and is therefore not explained here. Referring to the present example, the series of operations to measure the gate leakage current of a single test element 372 is explained.

The control section 14 turns off the first switches 374, and turns on the second switches 376. The control section 14 applies the gate voltage of substantially 0 V to the gate terminal of the test element 372 (step S416). At this stage, the gate leakage current is not generated in the test element 372.

After this, the control section 14 sets the voltage of the integral capacitance 388 at a predetermined initial voltage value. Specifically speaking, the control section 14 controls the reset transistor 380 to set the voltage of the integral capacitance 388 at the initial voltage $V_{R1}$. This is achieved by supplying the reset signal $\phi_{RES}$ that turns on the reset transistors 378 and 380.

After this, the characteristic measuring section 16 reads the variation in the voltage value of the integral capacitance 388 over a predetermined time period starting from when the voltage value of the integral capacitance 388 is set to the initial voltage value (step S418). Here, the control section 14 causes the column selecting section 302 and the row selecting section 304 to select the cell 310. The characteristic measuring section 16 receives the voltage output from the output section 320 as the voltage of the integral capacitance 388.

Subsequently, the characteristic measuring section 16 calculates the current value of the background current of the cell 310 (a first current value) with reference to the variation in the voltage output from the output section 320 over the above-mentioned predetermined time period (step S420). Here, since the gate leakage current is not generated in the test element 372, the integral capacitance 388 is charged and discharged by the background current. For this reason, the characteristic measuring section 16 can measure the background current based on the variation in the voltage of the integral capacitance 388 over the predetermined time period.

Following this, the control section 14 applies a positive or negative gate voltage to the gate terminal of the test element 372 (step S422). Here, the control section 14 controls the voltages VRN and VRP, to maintain the voltage applied between the gate and the source or between the gate and the drain of the test element 372 at a substantially constant level. In this way, the gate leakage current is generated in the test element 372 in accordance with the gate voltage.

After this, the control section 14 sets the voltage value of the integral capacitance 388 to the predetermined initial voltage value. The characteristic measuring section 16 then reads the variation in the voltage value of the integral capacitance 388 over the above-mentioned predetermined time period starting from when the voltage value of the integral capacitance 388 is set to the initial voltage value (step S424).

Subsequently, the characteristic measuring section 16 calculates a second current value indicating the sum of the background current and the gate leakage current with reference to the variation in the voltage value of the integral capacitance 388 over the predetermined time period (step S426). In this case, the integral capacitance 388 is charged and discharged by the current corresponding to the sum of the background current and the gate leakage current. Therefore, the characteristic measuring section 16 can measure the current corresponding to the sum of the background current and the gate leakage current with reference to the variation in the voltage of the integral capacitance 388 over the predetermined time period.

After this, the characteristic measuring section 16 calculates the current value indicating the gate leakage current by subtracting the first current value from the second current value (step S428). In the above-described manner, the characteristic measuring section 16 can eliminate the influence of the background current and thus accurately measure the gate leakage current of the test element 372. Also, the characteristic measuring section 16 can measure a small gate leakage current since the measurement is based on the integration of the gate leakage current. The characteristic measuring section 16 generates the identification information based on the current value indicating the gate leakage current of each test element 372.

Figure 12:
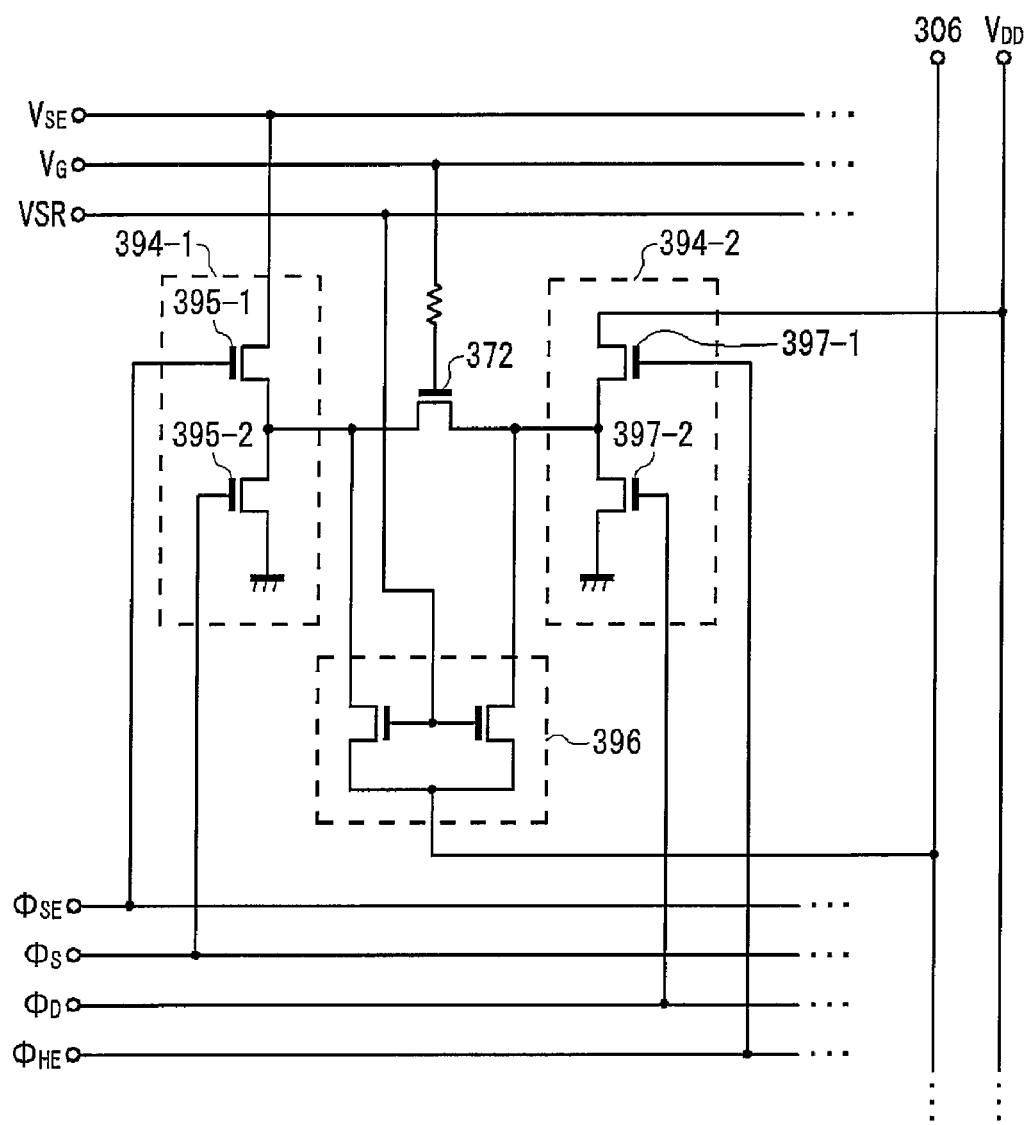
FIG. 12 illustrates a different exemplary configuration of each cell 310.

FIG. 12 illustrates a different exemplary configuration of each cell 310. According to the present example, each cell 310 receives from the control section 14 the voltages $V_{DD}$, $V_{SE}$, and $V_G$ and the signals $\phi_{SE}$, $\phi_S$, $\phi_D$ and $\phi_{HE}$, and receives from the row selecting section (VSR) 304 a position signal obtained by converting the selection signal.

Each cell 310 includes therein the test element 372, the stress applying section 394, and a column selecting transistor 396. The stress applying section 394 receives the voltages VSE and VDD and the signals φSE, φS, φD and φHE. The stress applying section 394 is connected to the source and drain terminals of the test element 372, and applies voltages to the source and drain terminals of the test element 372 in response to the signals supplied thereto.

According to the present example, the stress applying section 394 includes therein a source stress applying section 394-1 connected to the source terminal of the test element 372, and a drain stress applying section 394-2 connected to the drain terminal of the test element 372.

The source stress applying section 394-1 includes therein a bus line that receives the voltage $V_{SE}$ and two transistors (395-1 and 395-2) that are provided in series with each other so as to be positioned between the bus line and the ground potential. The two transistors 395-1 and 395-2 are connected to each other by means of a source-drain connection point, which is connected to the source terminal of the test element 372. The transistor 395-1, which is positioned closer to the bus line than the transistor 395-2 is, receives the signal $\phi_{SE}$ at the gate terminal thereof. The transistor 395-2, which is positioned closer to the ground potential than the transistor 395-1 is, receives the signal φS at the gate terminal thereof.

The drain stress applying section 394-2 includes a bus line that receives the voltage $V_{DD}$ and two transistors (397-1 and 397-2) that are provided in series with each other so as to be positioned between the bus line and the ground potential. The two transistors 397-1 and 397-2 are connected to each other by means of a source-drain connection point, which is connected to the drain terminal of the test element 372. The transistor 397-1, which is positioned closer to the bus line than the transistor 397-2 is, receives the signal $\phi_{HE}$ at the gate terminal thereof. The transistor 397-2, which is positioned closer to the ground potential than the transistor 397-1 is, receives the signal $\phi_D$ at the gate terminal thereof.

The control section 14 applies the signals $\phi_{SE}$, $\phi_S$, $\phi_D$ and $\phi_{HE}$ to the stress applying section 394. In accordance with the signals supplied thereto, the stress applying section 394 applies the stresses (1) to (4) mentioned with reference to FIG. 10 to the test element 372. For example, when the stress applying section 394 applies the stress (4), i.e., Source Erase to the test element 372, the control section 14 supplies the signal $\phi_S$ with the H level to the stress applying section 394.

When the stress applying section 394 applies the stress (2), i.e., FN Substrate Injection to the test element 372, the control section 14 may supply the signal $\phi_{SE}$ with the H level to the stress applying section 394. When the stress applying section 394 applies the stress (3), i.e., Hot Electron Injection to the test element 372, the control section 14 may supply the signal $\phi_{HE}$ with the H level to the stress applying section 394. When the stress applying section 394 applies the stress (1), i.e., FN Gate Injection to the test element 372, the control section 14 may supply the signal $\phi_D$ with the H level to the stress applying section 394.

As discussed above, the control section 14 controls the signals $\phi_{SE}$, $\phi_S$, $\phi_D$ and $\phi_{HE}$ in accordance with the stress to be applied to the test element 372, so that the voltages corresponding to the stress to be applied can be respectively applied to the source and drain terminals of the test element 372.

After causing the stress applying section 394 to sequentially apply the above-mentioned stresses to the test element 372, the measuring apparatus 100 measures the gate leakage current of the test element 372. For the measurement, the predetermined gate voltage $V_G$ is applied to the gate terminal of the test element 372. The row selecting section 304 turns on the column selecting transistor 396.

The column selecting transistor 396 includes therein a transistor that is connected to the source terminal of the test element 372 and controls whether to pass the source current therethrough, and a transistor that is connected to the drain terminal of the test element 372 and controls whether to pass the drain current therethrough. With such a configuration, the column selecting transistor 396 can pass the gate leakage current therethrough irrespective of whether the test element 372 is P or N type.

When each cell 310 is configured as illustrated in FIG. 12, the output section 320 receives the gate leakage current. According to the present example, the output section 320 has a function of outputting a current value. The characteristic measuring section 16 detects the gate leakage current characteristic of each test element 372 based on the current value output from the output section 320. With the above-described configuration, the measuring apparatus 100 can also measure the gate leakage current of each test element 372.

Figure 13:
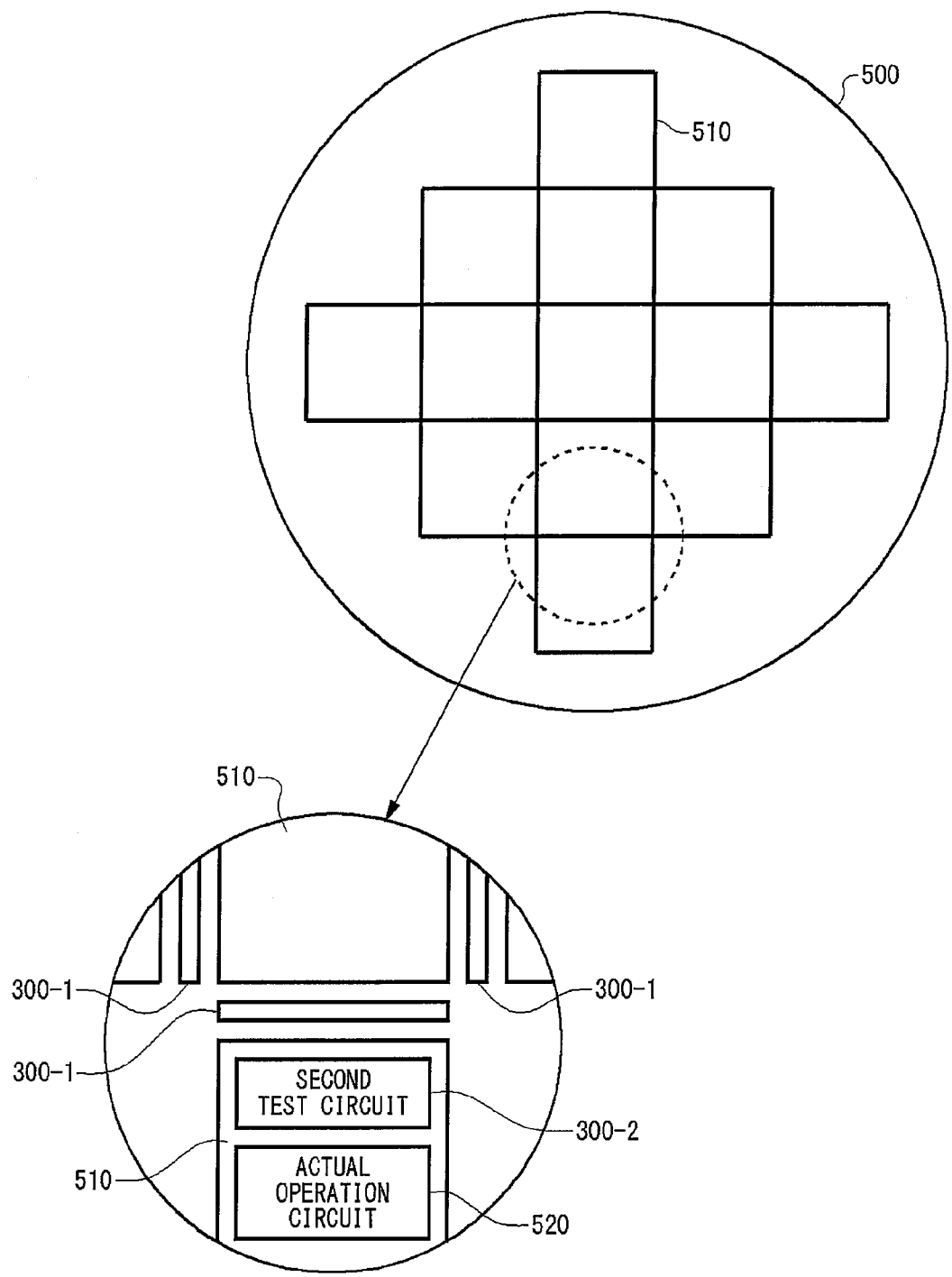
FIG. 13 illustrates a device manufacturing method for manufacturing each electronic device 510.

FIG. 13 illustrates a device manufacturing method for manufacturing each electronic device 510. The device manufacturing method relating to the present example manufactures the electronic device 510 including therein the actual operation circuit 520 which operates during the actual operation of the electronic device 510 and the test circuit 300 which has the plurality of test elements 314 formed therein and operates during the test of the electronic device 510. Also, the device manufacturing method relating to the present example manufactures the electronic device 510 whose identification information is obtained by the measuring apparatus 100 described in relation to FIG. 1.

To begin with, the actual operation circuits 520 of the respective electronic devices 510 are formed in the wafer 500. To be specific, the wafer 500 is partitioned into a plurality of regions which are respectively to form the individual electronic devices 510. The actual operation circuits 520 are formed in the regions obtained by partitioning the wafer 500 in a one-to-one correspondence.

Subsequently, first test circuits 300-1 are formed on the cutting lines along which the wafer 500 is cut into the separates electronic devices 510. The first test circuits 300-1 are formed in a one-to-one correspondence with the electronic devices 510. In addition, second test circuits 300-2 are formed in the wafer 500 in the regions different from the cutting lines. Specifically speaking, the second test circuits 300-2 are formed within the regions which are to form the individual electronic devices 510 in a one-to-one correspondence. The first and second test circuits 300-1 and 300-2 may have the same configuration as the test circuit 300 described with reference to FIG. 3, 10 or 12.

With the plurality of electronic devices 510 being formed in the wafer 500, the electrical characteristics of the test elements 314 provided in the first and second test circuits 300-1 and 300-2 corresponding to each electronic device 510 are measured. The result of the measurement may be used to judge whether each electronic device 510 is acceptable.

Here, the electrical characteristics of the test elements 314 provided in the second test circuit 300-2 are used to generate the identification information of the corresponding electronic device 510. The measurement of the electrical characteristics and the generation of the identification information are done by the measuring apparatus 100 in accordance with the series of operations described with reference to FIG. 4, 8, 9 or 11. The identification information storing section 20 stores thereon the identification information generated by the characteristic measuring section 16.

The wafer 500 is then cut into the separate electronic devices 510. In this manner, the electronic devices 510 are manufactured. The above-described method makes it possible to manufacture the electronic devices 510 having the second test circuits 300-2, which provide for identification information to identify the electronic devices 510, formed therein. Here, the test circuit 300 of each electronic device 510 is used to test the electronic device 510, but a portion of the test circuit 300 is not necessary to generate the identification information. The above-described method can remove such an unnecessary portion of the test circuit 300. Therefore, the above-described method can improve the area efficiency of the electronic devices 510.

For example, a case is assumed where whether each electronic device 510 is acceptable is judged by the unevenness of the electrical characteristics among the test elements 314 included in the first and second test circuits 300-1 and 300-2. In this case, it is preferable that the number of test elements 314 provided in the first and second test circuits 300-1 and 300-2 is as large as possible. For example, the test circuit 300 has approximately several tens of thousands of to one million test elements 314 provided therein.

However, the number of bits which is required for the identification information identifying each electronic device 510 is smaller than the number of test elements 314 which is required to accurately calculate the unevenness of the electrical characteristics. In addition, since the test elements 314 do not operate during the actual operation of each electronic device 510, the number of test elements 314 provided in each electronic device 510 is preferably as small as possible taking the area efficiency into consideration.

According to the present example, the test elements 314 which are not necessary to generate the identification information of each electronic device 510 are provided in the first test circuit 300-1, and the test elements 314 whose number is appropriate to generate the identification information are provided in the second test circuit 300-2. Here, the first test circuit 300 is positioned in the wafer 500 on the cutting lines. Therefore, the first test circuit 300-1 is not included in the finished electronic device 510. As a result, while the number of test elements 314 whose electrical characteristics are measured for the testing each electronic device 510 can be sufficiently large, the number of test elements 314 provided in each finished electronic device 510 can be reduced and each finished electronic device 510 can have the identification information therein.

The identification information storing section 20 preferably stores thereon the identification information of each electronic device 510 in association with the manufacturing history information such as the position of the electronic device 510 in the wafer 500. This configuration makes it possible to analyze, for example, the causes of the failures of the electronic devices 510 in detail.

Figure 14:
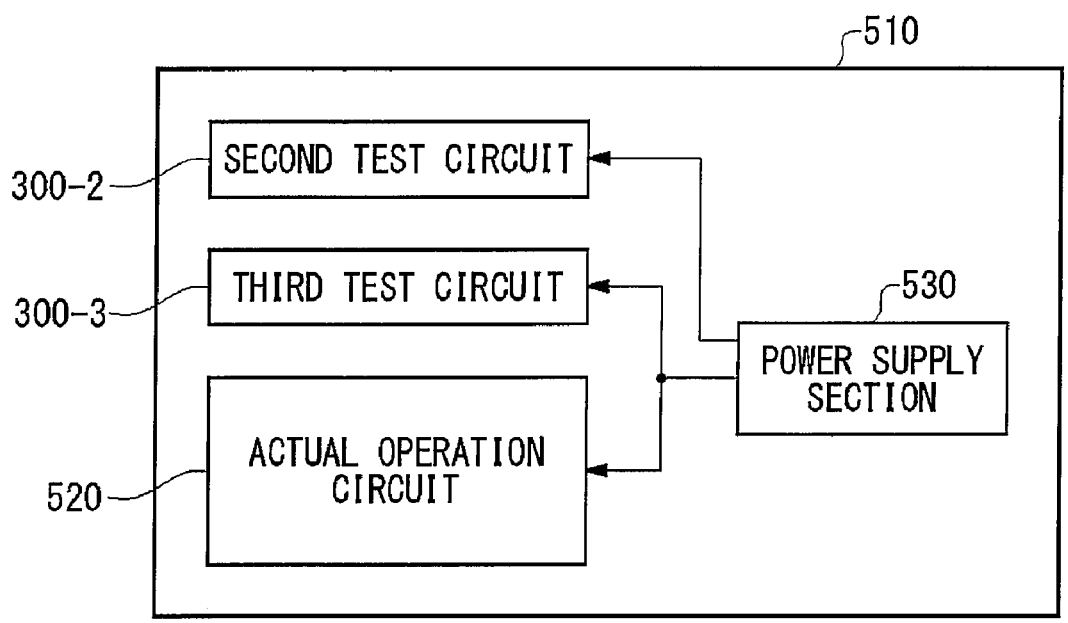
FIG. 14 illustrates a different exemplary configuration of each electronic device 510.

FIG. 14 illustrates a different exemplary configuration of each electronic device 510. According to the present example, the electronic device 510 includes therein the actual operation circuit 520, a third test circuit 300-3, the second test circuit 300-2 and a power supply section 530.

The actual operation circuit 520 operates during the actual operation of the electronic device 510. The third and second test circuits 300-3 and 300-2 operate during the test of the electronic device 510. Here, the third and second test circuits 300-3 and 300-2 have substantially the same circuit structure as each other. For example, the third and second test circuits 300-3 and 300-2 may have substantially the same configuration as the test circuit 300 described with reference to FIG. 3, 10, or 12.

The power supply section 530 does not apply the power supply voltage to the second test circuit 300-2 while applying the power supply voltage to the actual operation circuit 520 and the third test circuit 300-3, during the actual operation of the electronic device 510. The power supply section 530 applies the power supply voltage to the second test circuit 300-2 when the identification of the electronic device 510 is requested.

With the above-described configuration, it is possible to adapt the load of the third test circuit 300-3 in accordance with the environment under which the electronic device 510 actually operates. Here, since the power supply voltage is not applied to the second test circuit 300-2 during the actual operation of the electronic device 510, the test elements 314 provided in the second test circuit 300-2 experience only slight degradation in the electrical characteristics. Therefore, it is possible to analyze the degradation of the electronic device 510 in association with the environment under which the electronic device 510 is used, by measuring the difference between the electrical characteristics of the test elements 314 provided in the third test circuit 300-3 and the electrical characteristics of the test elements 314 provided in the second test circuit 300-2.

The measuring apparatus 100 prestores thereon the identification information generated based on the electrical characteristics of the test elements 314 provided in the second test circuit 300-2. To obtain the identification of the electronic device 510, the measuring apparatus 100 obtains identification information based on the electrical characteristics of the test elements 314 provided in the second test circuit 300-2. Since the test elements 314 provided in the second test circuit 300-2 experience only slight degradation in electrical characteristics, the measuring apparatus 100 can obtain accurate identification of the electronic device 510.

The power supply section 530 preferably applies substantially the same power supply voltage to the actual operation circuit 520 and the third test circuit 300-3. Which is to say, it is preferable to control the load of the third test circuit 300-3 to be substantially the same as the load of the actual operation circuit 520. In this way, the degradation of the test elements 314 provided in the third test circuit 300-3 can be made substantially the same as the degradation of the elements provided in the actual operation circuit 520. The power supply voltage supplied from the power supply section 530 may branch so as to be applied to the third test circuit 300-3 and the actual operation circuit 520. With this configuration, when applying the power supply voltage to the actual operation circuit 520, the power supply section 530 can also apply the power supply voltage to the third test circuit 300-3. Therefore, the power supply voltage can be applied to the actual operation circuit 520 and the third test circuit 300-3 for substantially the same time period.

The power supply section 530 preferably includes therein a first power supply line and a second power supply line separately provided from the first power supply line. The first power supply line applies the power supply voltage to the actual operation circuit 520 and the third test circuit 300-3, and the second power supply line applies the power supply voltage to the second test circuit 300-2.

The third test circuit 300-3 includes therein test elements, a selecting section, a characteristics output section and a maintaining section. The test elements are arranged in parallel with each other electrically. The selecting section sequentially turns on each of the test elements during the test of the electronic device 510. The characteristics output section sequentially outputs the terminal voltage of the test element which is sequentially turned on by the selecting section. The maintaining section maintains a plurality of test elements turned on during the actual operation of the electronic device.

For example, when the third test circuit 300-3 has the circuit structure shown in FIG. 3, the column selecting section 302, row selecting section 304, column selecting transistors 306, and row selecting transistors 316 together function as the selecting section. The output section 320 functions as the characteristics output section. The power supply section 530 supplies the voltages $V_{DD}$, $V_G$, $\phi_j$, and $V_{REF}$ described with reference to FIG. 3, to the third test circuit 300-3. By supplying the voltage $\phi j$ that turns on all the switching transistors 312 to the third test circuit 300-3, the power supply section 530 may function as the maintaining section.

The second test circuit 300-2 includes therein test elements, a selecting section, and an identification information output section. The test elements are arranged in parallel with each other electrically. The selecting section sequentially turns on each of the test elements during the test of the electronic device 510. The identification information output section outputs the terminal voltage of the test element which is sequentially turned on by the selecting section, as the identification information of the electronic device 510.

For example, when the second test circuit 300-2 has the circuit structure shown in FIG. 3, the column selecting section 302, row selecting section 304, column selecting transistors 306, and row selecting transistors 316 together function as the selecting section. The output section 320 functions as the identification information output section.

Although some aspects of the present invention have been described by way of exemplary embodiments, it should be understood that those skilled in the art might make many changes and substitutions without departing from the spirit and the scope of the present invention which is defined only by the appended claims.

What is claimed is:

1. A device identifying method for identifying an electronic device including therein an actual operation circuit and a test circuit having a test element provided therein, the actual operation circuit operating during an actual operation of the electronic device, the test circuit operating during a test of the electronic device, the device identifying method comprising:

obtaining identification information of the certain electronic device by measuring a characteristic of the test element provided in the electronic device, originally for evaluating the characteristics of the electronic device, in order to identify the electronic device;

comparing the identification information obtained in the identification information obtaining with prestored one or more pieces of identification information of electronic devices individually representing characteristics of test elements provided in the electronic devices;

when the obtained identification information matches one of the prestored pieces of identification information, judging that the electronic device is the same as the electronic device associated with the matching identification information; and judging whether the electronic device is defective or not based on the characteristic of the test element.

2. The device identifying method as set forth in claim 1, further comprising:

measuring the characteristics of the test elements provided in the electronic devices; and storing the pieces of identification information of the electronic devices by storing the measured characteristics of the test elements.

3. The device identifying method as set forth in claim 2, wherein the characteristics measuring includes measuring the characteristics of the test elements in the electronic devices under a condition that the electronic devices are formed in a same wafer, and the identification information obtaining includes measuring the characteristic of the test element provided in the electronic device after the wafer is cut into the separate electronic devices one of which is the electronic device.

4. The device identifying method as set forth in claim 1, wherein the test circuit has a plurality of test elements provided therein.

5. The device identifying method as set forth in claim 1, wherein in the identification information obtaining, an electrical characteristic of the test element is measured.

6. The device identifying method as set forth in claim 1, wherein the judging whether the electronic device is defective or not is performed in terms of an original function of the electronic device, independent of the identification of the electronic device.

7. A device identifying method for identifying an electronic device including therein an actual operation circuit and a test circuit having a test element provided therein, the actual operation circuit operating during an actual operation of the electronic device, the test circuit operating during a test of the electronic device, the device identifying method comprising:

obtaining identification information of a certain electronic device by measuring a characteristic of a test element provided in the certain electronic device, originally for evaluating the characteristics of the certain electronic device, in order to identify the certain electronic device;

comparing the identification information obtained in the identification information obtaining with prestored one or more pieces of identification information of electronic devices individually representing characteristics of test elements provided in the electronic devices;

when the obtained identification information matches one of the prestored pieces of identification information, judging that the certain electronic device is the same as the electronic device associated with the matching identification information;

measuring the characteristics of the test elements provided in the electronic devices; and storing the pieces of identification information of the electronic devices by storing the measured characteristics of the test elements;

wherein the identification information storing includes storing one or more pieces of information respectively indicating whether the characteristics of the test elements in the electronic devices are higher than a predetermined first reference value, as the pieces of identification information, and the identification information storing includes obtaining information indicating whether the characteristic of the test element in the certain electronic device is higher than a second reference value different from the first reference value, as the identification information.

8. The device identifying method as set forth in claim 7, further comprising evaluating degradation of the certain electronic device based on a difference between the characteristic of the test element in the certain electronic device measured in the characteristics measuring and the characteristic of the test element in the certain electronic device measured in the identification information obtaining, when the obtained identification information matches one of the prestored pieces of identification information in the judging.

* * * * *